(12) United States Patent
Pirovano et al.

(10) Patent No.: US 11,164,627 B2
(45) Date of Patent: Nov. 2, 2021

(54) POLARITY-WRITTEN CELL ARCHITECTURES FOR A MEMORY DEVICE

(71) Applicant: Micron Technology, Inc., Boise, ID (US)

(72) Inventors: Agostino Pirovano, Milan (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/257,521

(22) Filed: Jan. 25, 2019

(65) Prior Publication Data

US 2020/0243136 A1 Jul. 30, 2020

(51) Int. Cl.
G11C 13/00 (2006.01)
G11C 11/56 (2006.01)

(52) U.S. Cl.
CPC ...... G11C 13/0069 (2013.01); G11C 11/5678 (2013.01); G11C 13/0004 (2013.01); G11C 13/004 (2013.01); G11C 2013/005 (2013.01); G11C 2013/0073 (2013.01)

(58) Field of Classification Search
CPC ............ G11C 11/5678; G11C 13/0004; G11C 11/5614
USPC ........................................................ 365/148
See application file for complete search history.

(56) References Cited

U.S. PATENT DOCUMENTS 9,646,692 B1 * 5/2017 Lung ................. G11C 13/0004
10,134,470 B2 11/2018 Tortorelli et al.
2006/0067114 A1 * 3/2006 Hachino ................ G11C 13/02
365/158
2012/0243307 A1 9/2012 Takashima
2014/0050011 A1 * 2/2014 Sone .................. G11C 13/0097
365/148

(Continued)

FOREIGN PATENT DOCUMENTS

KR 20060034398 A 4/2006
KR 20100137813 A 12/2010

OTHER PUBLICATIONS

ISA/KR, International Search Report and Written Opinion of the International Searching Authority, Int'l Appl. No. PCT/US2019/067409, dated Apr. 21, 2020, Korean Intellectual Property Office, Seo-gu, Daejeon, Republic of Korea, 11 pgs.

*Primary Examiner* — Alfredo Bermudez Lozada
(74) *Attorney, Agent, or Firm* — Holland & Hart LLP

(57) ABSTRACT

Methods, systems, and devices for polarity-written cell architectures for a memory device are described. In an example, the described architectures may include memory cells that each include or are otherwise associated with a material configured to store one of a set of logic states based at least in part on a polarity of a write voltage applied to the material. Each of the memory cells may also include a cell selection component configured to selectively couple the material with an access line. In some examples, the material may include a chalcogenide, and the material may be configured to store each of the set of logic states in an amorphous state of the chalcogenide. In various examples, different logic states may be associated with different compositional distributions of the material of a respective memory cell, different threshold characteristics of the material of a respective memory cell, or other characteristics.

20 Claims, 11 Drawing Sheets

(56) References Cited

U.S. PATENT DOCUMENTS

2015/0263069 A1 9/2015 Jo
2017/0125097 A1 5/2017 Tortorelli et al.

* cited by examiner

POLARITY-WRITTEN CELL ARCHITECTURES FOR A MEMORY DEVICE

BACKGROUND

The following relates generally to memory devices and more specifically to polarity-written cell architectures for a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), static RAM (SRAM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory (SSM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices may include increasing memory cell density, increasing read/write speeds, increasing reliability, increasing data retention, reducing power consumption, or reducing manufacturing costs, among other metrics. In some applications, it may be desirable to use relatively low voltages for accessing memory cells. Increasing read or write margins, decreasing sensitivity to degradation or destruction of a stored logic state, as well as other improvements, may further be desired, including for memory cell architectures that use relatively low voltages for accessing memory cells.

DETAILED DESCRIPTION

Figure 1:
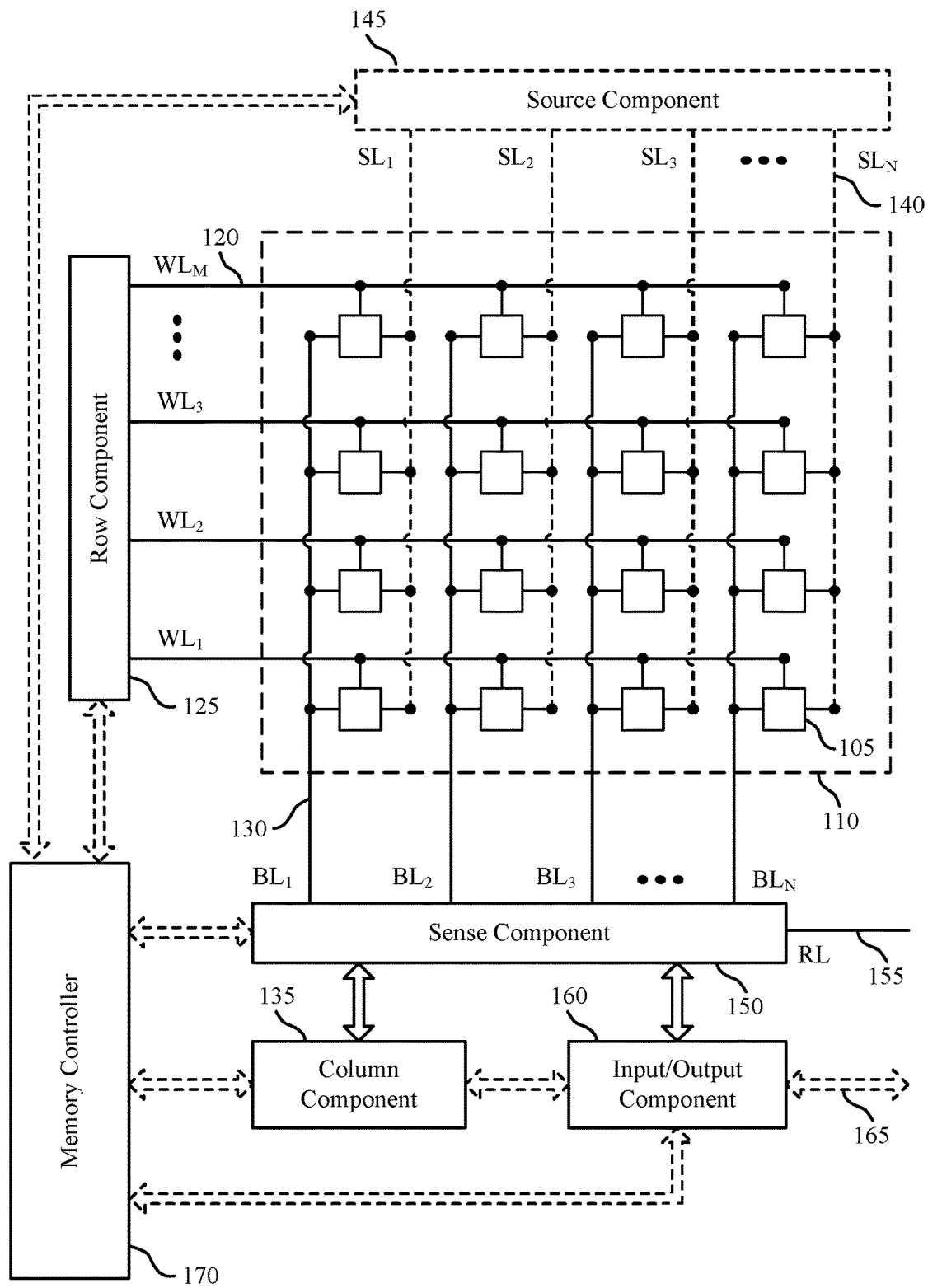
FIG. 1 illustrates an example of a memory device that supports polarity-written cell architectures in accordance with examples as disclosed herein.

Embedded applications such as consumer devices (e.g., smart phones and other portable devices), automotive systems, and industrial systems may include a memory system and a microcontroller along with various other types of circuitry to implement related functions. These applications often have tight constraints on size (e.g., area, footprint), power consumption, and other characteristics. Thus, chips or dice that integrate a memory system and other circuitry within a small footprint or with relatively low power consumption may be desirable, for embedded or other applications.

A wide variety of applications, including but not limited to embedded applications, may benefit from a non-volatile memory cell architecture that uses relatively low currents and relatively low voltages to support various access operations (e.g., read operations, write operations, rewrite operations, refresh operations). In some examples, it may be advantageous to employ a memory cell architecture configured to use a same or similar range of voltages associated with other functions of a system that includes the non-volatile memory. For example, in an embedded application, it may be advantageous to employ a non-volatile cell architecture that uses a range of voltages for access operations that is the same as or similar to (e.g., within) a range of voltages associated with processing circuits, such as a microcontroller, of the embedded application.

In one example, a memory cell architecture may store a logic state in a material (e.g., in a physical characteristic of the material), such as a chalcogenide, where the stored logic state is based at least in part on a polarity of voltage applied across the material during a write operation. In some examples, the stored logic state may be based on compositional migration or segregation in a given memory cell, where some constituents (e.g., ions, elements, compounds) of the material migrate towards a positively-biased node or electrode of the memory cell, or some constituents of the material migrate towards a negatively-biased node or electrode of the memory cell, or both. Thus, a particular compositional distribution of a material of a memory cell (e.g., an anisotropy between nodes) corresponding to a logic state may be encouraged during a write operation based at least in part on a voltage polarity between the nodes of the memory cell.

In some examples, the polarity used for programming may be accompanied by a particular behavior or characteristic of the material, such as a threshold voltage of the material, which may be used to detect a logic state stored by the memory cell (e.g., in a read operation). For example, one voltage polarity of a write operation may be associated with a relatively high threshold voltage of the material (e.g., for a particular read operation, for a particular read voltage), whereas another voltage polarity of a write operation may be associated with a relatively low threshold voltage of the material (e.g., for the particular read operation, for the particular read voltage). In such examples, a presence or absence of current through the material in response to a read voltage applied across the material may be used to determine (e.g., distinguish) whether the memory cell was written with one voltage polarity or another, thereby providing an indication of the logic state that was written to the memory cell (e.g., each logic state may correspond to a different threshold voltage of the material, and thus the presence or absence of current through the material in response to the read voltage may be used to determine the threshold voltage of the material).

In some examples, relatively small write voltage magnitudes may generally be associated with relatively smaller differences in material behavior or characteristics (e.g., threshold characteristics) of a written memory cell for distinguishing stored logic states, which may be compounded by statistical differences between different memory cells. Additionally or alternatively, in some examples, logic states stored by memory cells that are written with relatively smaller voltage magnitudes may be more sensitive to disruption or degradation than logic states stored by memory cells that are written with relatively larger voltage magnitudes. In some examples, such disruption or degradation may result from access operations that are performed on other memory cells. For example, voltages of an access operation applied to access lines that intersect at a target cell may cause changes of non-target cells that share the access lines, thereby potentially degrading or destroying logic states stored by the non-target cells. Further, in some examples, memory cells including a material written with relatively smaller voltage magnitudes may be relatively more prone to leakage or inadvertent selection or thresholding (e.g., undesirable current flow through a non-target memory cell), which may be associated with difficulties in sensing a target memory cell (e.g., due to additional current flowing through non-target memory cells being indeterminate from current flowing through a target memory cell at a sense component).

In accordance with examples of the present disclosure, a device may include memory cells that each include or are otherwise associated with a material configured to store one of a set of logic states, and a cell selection component (e.g., a transistor, a dedicated complementary metal-oxide semiconductor (CMOS) selector) configured to selectively couple or isolate the material and an access line (e.g., based on an activation signal). In some examples, logic states stored by the material may be based at least in part on a polarity of a write voltage applied to the material. In some examples, the material may be configured to store some or all of the set of logic states in an amorphous state of the material (e.g., based on different threshold characteristics, such as threshold voltages, of the material in the amorphous material state, based on different compositional distributions of the material in the amorphous state). In some examples, the material of the memory cells may include a chalcogenide. The material associated with the memory cells may be coupled with a node, an electrode, or a plate that is common to all of the memory cells of the device (e.g., a common source, a source plate), or may be coupled with a node, an electrode, or an access line that is common to some subset of the memory cells of the device (e.g., a source line that is controllable independently from a source line associated with another subset of the memory cells).

The described architectures for polarity-written memory cells may support a non-volatile memory function that uses relatively low voltages and low currents for writing and reading a material of target memory cells while the material of non-target memory cells may be selectively isolated from some aspects of writing and reading operations. Further, the described architectures may improve retention of logic states stored by the material of the memory cells by selectively coupling or decoupling the material from other nodes components during various operations (e.g., access operations) via the cell selection component.

Figure 2:
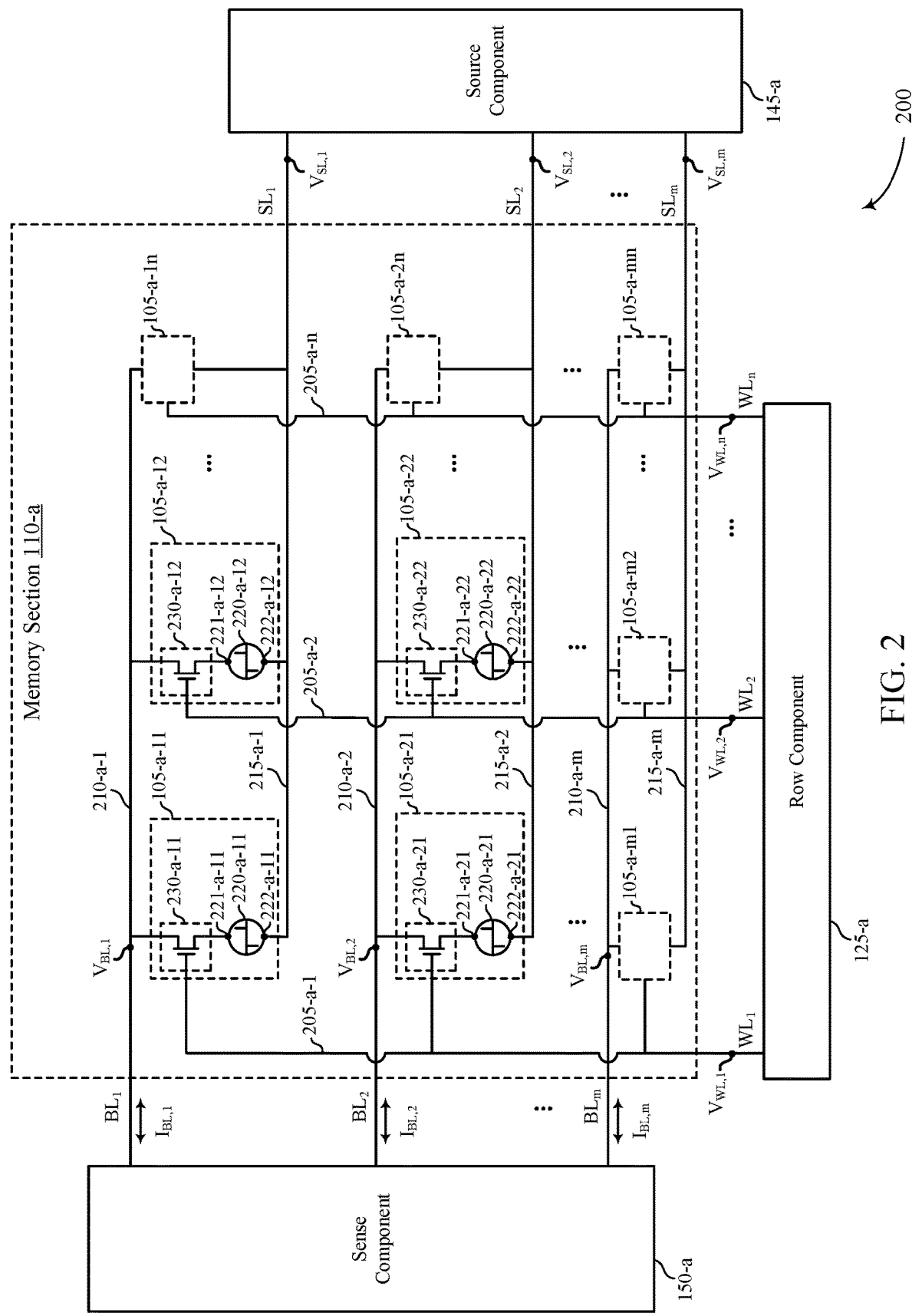
FIG. 2 illustrates an example of a circuit that supports polarity-written cell architectures for a memory device in accordance with examples as disclosed herein.

Features of the disclosure are initially described in the context of memory systems and circuitry with reference to FIGS. 1 and 2. Features of the disclosure are further described in the context of timing diagrams with reference to FIGS. 3-6, and physical layouts with reference to FIGS. 7 and 8. These and other features of the disclosure are further illustrated by and described with reference to an apparatus diagram and flowcharts that relate to polarity-written cell architectures for a memory device as described with references to FIGS. 9-11.

FIG. 1 illustrates an example of a memory device 100 that supports polarity-written cell architectures in accordance with the present disclosure. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states. The different logic states may be programmed to a particular memory cell 105 based at least in part on different voltage polarities applied to or across the memory cell 105 during a write operation.

The set of memory cells 105 may be part of a memory section 110 of the memory device 100 (e.g., including an array of memory cells 105), where, in some examples, a memory section 110 may refer to a contiguous tile of memory cells 105 (e.g., a contiguous set of elements of a semiconductor chip). In some examples, a memory section 110 may refer to the smallest set of memory cells 105 that may be biased in an access operation, or a smallest set of memory cells 105 that share a common node (e.g., a common source node, a common source plate, a set of source lines that are biased to a common voltage). Although a single memory section 110 of the memory device 100 is shown, various examples of a memory device in accordance with the present disclosure may have a set of more than one memory section 110. In one illustrative example, a memory device 100, or a subsection thereof (e.g., a core of a multi-core memory device 100, a chip of a multi-chip memory device) may include 32 "banks" and each bank may include 32 sections. Thus, a memory device 100, or subsection thereof, according to the illustrative example may include 1,024 memory sections 110.

In various examples, a memory cell 105 may include a material, which may be referred to as a memory element, a memory storage element, a material memory element, a material portion, a polarity-written material portion, and others. The material may have one or more variable and configurable characteristics that are representative of (e.g., correspond to) different logic states, which may include different electrical resistances, different threshold voltages, and others. For example, a material may take different forms, different atomic configurations or distributions, or otherwise maintain different characteristics based on a polarity of a voltage (e.g., an orientation of an electric field)

across the material during a write operation, and such a material may have different electrical resistances or threshold characteristics depending on a polarity of a voltage during the write operation. In one example, a state of the material after a write operation with a positive voltage polarity may have a relatively low electrical resistance or threshold voltage, whereas a state of the material after a write operation with a negative voltage polarity may have a relatively high electrical resistance or threshold voltage. In some cases, a relatively high or low resistance or threshold voltage of a written memory cell 105 may be associated with or be otherwise based at least in part on a polarity of a voltage applied during a read operation. For example, a material of a memory cell 105 having a relatively high or low resistance or threshold voltage may be dependent on whether a read operation performed on the memory cell 105 has a same polarity, or a different polarity (e.g., an opposite polarity), as a preceding write operation.

In some cases, a material of a memory cell 105 may be associated with a threshold voltage. For example, electrical current may flow through the material when a voltage greater than the threshold voltage is applied across the memory cell 105, and electrical current may not flow through the material, or may flow through the material at a rate below some level (e.g., according to a leakage rate), when a voltage less than the threshold voltage is applied across the memory cell 105. Thus, a voltage applied to memory cells 105 may result in different current flow, or different perceived resistance, depending on whether a material portion of the memory cell 105 was written with a positive voltage polarity or a negative voltage polarity. Accordingly, the magnitude or other characteristic associated with the current that results from applying a read voltage to the memory cell 105 may be used to determine a logic state stored by memory cell 105.

In the example of memory device 100, each row of memory cells 105 of the memory section 110 may be coupled with one of a set of first access lines 120 (e.g., a word line (WL), such as one of $WL_1$ through $WL_M$), and each column of memory cells 105 may be coupled with one of a set of second access lines 130 (e.g., a bit line (BL), such as one of $BL_1$ through $BL_N$). The plurality of first access lines 120 may be coupled with a row component 125, which may control various operations such as activating one or more of the plurality of first access lines 120, or selectively coupling one or more of the plurality of first access lines 120 with a voltage source or other circuit element. The plurality of second access lines 130 may be coupled with a sense component 150, which may support the detection of logic states stored by memory cells 105. In some examples, a sense component 150 may be in communication with a column component 135, or may include or be otherwise co-located with a column component 135, where a column component 135 may control various operations such as activating one or more of the plurality of second access lines 130, or selectively coupling one or more of the plurality of second access lines 130 with a voltage source or other circuit element.

In some examples, a row of memory cells 105 of a different memory section 110 (not shown) may be coupled with one of a different plurality of first access lines 120 (e.g., a word line different than $WL_1$ through $WL_M$), and a column of memory cells 105 of the different memory section 110 may be coupled with one of a different plurality of second access lines 130 (e.g., a bit line different than $BL_1$ through $BL_N$). In some cases, first access lines 120 and second access lines 130 may be substantially perpendicular to one another in the memory device 100 (e.g., when viewing a plane of a deck of the memory device 100, as shown in FIG. 1). References to word lines and bit lines, or their analogues, are interchangeable without loss of understanding or operation.

In general, one memory cell 105 may be located at the intersection of (e.g., coupled with, coupled between) a first access line 120 and a second access line 130. This intersection, or an indication of this intersection, may be referred to as an address of a memory cell 105. A target or selected memory cell 105 may be a memory cell 105 located at the intersection of an energized or otherwise selected first access line 120 and an energized or otherwise selected second access line 130. In other words, a first access line 120 and a second access line 130 may be energized or otherwise selected to access (e.g., read, write, rewrite, refresh) a memory cell 105 at their intersection. Other memory cells 105 that are not at the intersection of a targeted memory cell 105 may be referred to as non-target or non-selected memory cells 105.

The memory cells 105 of the memory section 110 may also be coupled with one of a plurality of third access lines 140 (e.g., a source line (SL), such as one of $SL_1$ through $SL_N$). The plurality of third access lines 140 may be coupled with a source component 145, which may control various operations such as activating one or more of the plurality of third access lines 140, or selectively coupling one or more of the plurality of third access lines 140 with a voltage source or other circuit element. Although the plurality of third access lines 140 of the memory device 100 are shown as being parallel with the plurality of second access lines 130, in other examples, a plurality of third access lines 140 may be parallel with the plurality of first access lines 120, or in any other configuration. For example, in the example of memory device 100, each of the third access lines 140 may correspond to a respective one of the second access lines 130. In another example, not shown, each of the third access lines 140 may correspond to a respective one of the first access lines 120.

Although illustrated as separate lines, in some examples, the plurality of third access lines 140 may represent or be otherwise functionally equivalent with a common source line, a common source plate, or some other common node of the memory section 110 (e.g., a node common to each of the memory cells 105 in the memory section 110), or other common node of the memory device 100 (e.g., a node common to more than one memory section 110). In some examples, memory cells 105 of a different memory section 110 (not shown) may be coupled with one of a different plurality of third access lines 140 (e.g., a set of source lines different than $SL_1$ through $SL_N$, a different common source line, a different common source, a different common node), which may be electrically isolated and independently controllable from the illustrated third access lines 140 (e.g., source lines $SL_1$ through $SL_N$).

In some architectures, the logic storing component (e.g., a material portion) of a memory cell 105 may be electrically coupled with or isolated from a respective third access line 140 by a cell selection component, which, in some examples, may be referred to as a switching component or a selector device. A cell selection component may be coupled with one of the first access lines 120 (e.g., via a control node or terminal of the cell selection component), which may be configured to control the cell selection component of or associated with the memory cell 105. For example, when the cell selection component of a memory cell 105 is a transistor, the first access line 120 may be coupled with a gate of the transistor (e.g., where a gate of the transistor may be a control node of the transistor), and the source and drain of the transistor (e.g., the nodes of the transistor that may be selectively coupled or isolated, the nodes of the transistor between which current may be selectively permitted or blocked) may be coupled with a third access line 140 or a material associated with the memory cell. Activating a first access line 120 may result in an electrical connection or closed circuit (e.g., a selective coupling) between the material of one or more memory cells 105 along the activated first access line 120 and their corresponding third access lines 140. Deactivating a first access line 120 may result in an isolation or open circuit (e.g., a selective isolation) between the material of one or more memory cells 105 along the deactivated first access line 120 and their corresponding third access lines 140. In some examples, current flowing through a material of a memory cell 105 (e.g., via a second access line 130, enabled by the selective activation of a cell selection component) may be used to read or write the material of the memory cell 105.

In some examples, a second access line 130 may provide access to one area (e.g., one side, one end) of the material of a memory cell 105, and a third access line 140 may provide access to another area (e.g., a different side, an opposite side, an opposite end) of the material of the memory cell 105. Thus, a second access line 130 and a third access line 140 may support applying voltage across a material portion of a memory cell 105 with different polarities (e.g., a first polarity when a voltage of a second access line 130 is higher than a voltage of a third access line 140, a second polarity when a voltage of a second access line 130 is lower than a voltage of a third access line 140). Although the access lines described with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those described herein.

Access operations such as reading, writing, rewriting, and refreshing may be performed on a memory cell 105 by activating or selecting a first access line 120, a second access line 130, or a third access line 140 coupled with the memory cell 105, which may include applying a voltage, a charge, or a current to the respective access line. Access lines 120, 130, and 140 may be made of conductive materials, such as metals (e.g., copper (Cu), silver (Ag), aluminum (Al), gold (Au), tungsten (W), titanium (Ti)), metal alloys, carbon, or other conductive or semi-conductive materials, alloys, or compounds. Upon selecting a memory cell 105, a resulting signal (e.g., a cell access signal, a cell read signal) may be used to determine the logic state stored by the memory cell 105. For example, a memory cell 105 with a material portion storing a logic state may be selected, and the resulting flow of current via an access line (e.g., via a second access line 130), or lack thereof, may be detected, converted, or amplified to determine the programmed logic state stored by the memory cell 105.

Accessing memory cells 105 may be controlled through a row component 125 (e.g., a row decoder), a column component 135 (e.g., a column decoder), or a source component 145 (e.g., a source driver), or a combination thereof. For example, a row component 125 may receive a row address from the memory controller 170 and select, activate, or bias the appropriate first access line 120 based on the received row address. Similarly, a column component 135 may receive a column address from the memory controller 170 and select, activate, or bias the appropriate second access line 130. Thus, in some examples, a memory cell 105 may be accessed by selecting or activating a first access line 120 and a second access line 130. In some examples, such access operations may be accompanied by a source component 145 selecting, activating, or biasing one or more of the third access lines 140 (e.g., biasing one of the third access lines 140 of the memory section 110, biasing all of the third access lines 140 of the memory section, biasing a common source plate of the memory section 110 or the memory device 100, biasing a common source node of the memory section 110 or the memory device 100). In various examples, any one or more of the row component 125, the column component 135, or the source component 145 may be referred to as, or otherwise include access line drivers or access line decoders.

In some examples, the memory controller 170 may control the operation (e.g., read operations, write operations, rewrite operations, refresh operations) of memory cells 105 through the various components (e.g., row component 125, column component 135, source component 145, sense component 150). In some cases, one or more of the row component 125, the column component 135, the source component 145, and the sense component 150 may be co-located or otherwise included with the memory controller 170. In some examples, one or more of the column component 135, the source component 145, or the sense component 150 may be co-located (e.g., in common circuitry, in a common portion of the memory device 100). In some examples, any one or more of a row component 125, a column component 135, or a source component 145 may also be referred to as a memory controller or circuitry for performing access operations of the memory device 100. In some examples, any one or more of a row component 125, a column component 135, or a source component 145 may be described as controlling or performing operations for accessing a memory device 100, or controlling or performing operations for accessing the memory section 110 of the memory device 100.

The memory controller 170 may generate row and column address signals to activate a target first access line 120 and second access line 130. The memory controller 170 may also generate or control various voltages or currents used during the operation of memory device 100. Although a single memory controller 170 is shown, a memory device 100 may have more than one memory controller 170 (e.g., a memory controller 170 for each of a set of memory sections 110 of a memory device 100, a memory controller 170 for each of a number of subsets of memory sections 110 of a memory device 100, a memory controller 170 for each of a set of chips of a multi-chip memory device 100, a memory controller 170 for each of a set of banks of a multi-bank memory device 100, a memory controller 170 for each core of a multi-core memory device 100, or any combination thereof), where different memory controllers 170 may perform the same functions or different functions.

Although the memory device 100 is illustrated as including a single row component 125, a single column component 135, and a single source component 145, other examples of a memory device 100 may include different configurations to accommodate a memory section 110 or a set of memory sections 110. For example, in various memory devices 100 a row component 125 may be shared among a set of memory sections 110 (e.g., having subcomponents common to all of the set of memory sections 110, having subcomponents dedicated to respective ones of the set of memory sections 110), or a row component 125 may be dedicated to one memory section 110 of a set of memory sections 110.

Likewise, in various memory devices 100, a column component 135 may be shared among a set of memory sections 110 (e.g., having subcomponents common to all of the set of memory sections 110, having subcomponents dedicated to respective ones of the set of memory sections 110), or a column component 135 may be dedicated to one memory section 110 of a set of memory sections 110. Additionally, in various memory devices 100, a source component 145 may be shared among a set of memory sections 110 (e.g., having subcomponents common to all of the set of memory sections 110, having subcomponents dedicated to respective ones of the set of memory sections 110), or a source component 145 may be dedicated to one memory section 110 of a set of memory sections 110.

A material of a memory cell 105 may be set or written or refreshed by biasing various combinations of the associated first access line 120, second access line 130, or third access line 140 (e.g., via a memory controller 170). In other words, a logic state may be stored in the material of a memory cell 105 (e.g., via a cell access signal, via a cell write signal). Row component 125, column component 135, or source component 145 may accept data, for example, via input/output component 160, to be written to the memory cells 105. In some examples, a write operation may be performed at least in part by a sense component 150, or a write operation may be configured to bypass a sense component 150 (e.g., being performed by a column component 135). The material of a memory cell 105 may be written with a logic state that is based at least in part on a polarity of a write voltage across the memory cell 105, which, in some examples, may be accompanied by a write current (e.g., based at least in part on the write voltage) or other heating of the memory cell.

A material of a memory cell 105 may be read (e.g., sensed) by a sense component 150 when the memory cell 105 is accessed (e.g., in cooperation with the memory controller 170) to determine a logic state stored by the memory cell 105. For example, the sense component 150 may be configured to sense a current or charge through the memory cell 105, or a voltage resulting from coupling the memory cell 105 with the sense component 150 or other intervening component (e.g., a signal development component between the memory cell 105 and the sense component 150), responsive to a read operation. The sense component 150 may provide an output signal indicative of (e.g., based at least in part on) the logic state stored by the memory cell 105 to one or more components (e.g., to the column component 135, the input/output component 160, the memory controller 170). In some examples, the detected logic state may be provided to a host device (e.g., a device that uses the memory device 100 for data storage, a processor coupled with the memory device 100 in an embedded application), where such signaling may be provided directly from the input/output component (e.g., via I/O line 165) or via the memory controller 170. In various memory devices 100, a sense component 150 may be shared among a set or bank of memory sections 110 (e.g., having subcomponents common to all of the set or bank of memory sections 110, having subcomponents dedicated to respective ones of the set or bank of memory sections 110), or a sense component 150 may be dedicated to one memory section 110 of a set or bank of memory sections 110.

During or after accessing a memory cell 105, the material portion of a memory cell 105 may or may not permit electrical charge or current to flow via its corresponding access lines 130 or 140 (e.g., in response to a read voltage). Such charge or current may result from biasing, or applying a voltage, to the memory cell 105 from one or more voltage sources or supplies (not shown) of the memory device 100, where voltage sources or supplies may be part of a row component 125, a column component 135, a source component 145, a sense component 150, a memory controller 170, or some other component (e.g., a biasing component). The described biasing may be supported by an activation of a cell selection component of a target memory cell 105, a deactivation of a cell selection component of a non-target memory cell 105, or both.

In some examples, when a read signal (e.g., a read pulse, a read current, a read voltage) is applied across a memory cell 105 with a material storing a first logic state (e.g., a logic 0, associated with a first write polarity), the memory cell 105 may conduct current due to the read pulse exceeding a threshold voltage of the memory cell 105. In response to, or based at least in part on this, the sense component 150 may therefore detect a current through the memory cell 105 (e.g., via a second access line 130) as part of determining the logic state stored by the memory cell 105. When a read pulse is applied to the memory cell 105 with the memory element storing a second logic state (e.g., a logic 1, associated with a second write polarity different than the first write polarity), the memory cell 105 may not conduct current due to the read pulse not exceeding the threshold voltage of the memory cell 105. The sense component 150 may therefore detect little or no current through the memory cell 105 as part of determining the stored logic state.

In some examples, a reference current may be defined for sensing the logic state stored by a memory cell 105. The reference current may be set above a current that passes through the memory cell 105 when the memory cell 105 does not threshold in response to the read pulse, but equal to or below an expected current through the memory cell 105 when the memory cell 105 does threshold in response to the read pulse. For example, the reference current may be higher than a leakage current of the associated access lines 130 or 140 (e.g., higher than a leakage current associated with one or more memory cells 105 coupled with an access line 130 or 140 that is common with a target memory cell 105). In some examples, a logic state stored by a memory cell 105 may be determined based at least in part on a voltage (e.g., across a shunt resistance) resulting from the current driven by a read pulse. For example, the resulting voltage may be compared relative to a reference voltage (e.g., as generated within the sense component 150 or provided via a reference line (RL) 155), with a resulting voltage less than the reference voltage corresponding to a first logic state and a resulting voltage greater than the reference voltage corresponding to a second logic state.

In some examples, more than one voltage may be applied when reading a memory cell 105 (e.g., multiple voltages may be applied during portions of a read operation). For example, if an applied read voltage does not result in current flow, one or more other read voltages or voltage polarities may be applied (e.g., until a current is detected by sense component 150). Based at least in part on assessing the read voltage that resulted in current flow, the stored logic state of the memory cell 105 may be determined. In some cases, a read voltage may be ramped (e.g., smoothly increasing higher in magnitude) until a current flow or other condition is detected by a sense component 150. In other cases, predetermined read voltages may be applied (e.g., a predetermined sequence of read voltages that increase higher in magnitude in a stepwise manner, a predetermined sequence of read voltages that include different read voltage polarities) until a current is detected. Likewise, a read current may be applied to a memory cell 105 and the magnitude or polarity of the voltage to create the read current may depend on the electrical resistance or the total threshold voltage of the memory cell 105.

A sense component 150 may include various switching components, selection components, multiplexers, transistors, amplifiers, capacitors, resistors, voltage sources, or other components to detect, convert, or amplify a difference in sensing signals (e.g., a difference between a read voltage and a reference voltage, a difference between a read current and a reference current), which, in some examples, may be referred to as latching or generating a latch signal. In some examples, a sense component 150 may include a collection of components (e.g., circuit elements, circuitry) that are repeated for each of a set of second access lines 130 connected to the sense component 150. For example, a sense component 150 may include a separate sensing circuit or circuitry (e.g., a separate sense amplifier, a separate signal development component) for each of a set of second access lines 130 coupled with the sense component 150, such that a logic state may be separately detected for a respective memory cell 105 coupled with a respective one of the set of second access lines 130. In some examples, a reference signal source (e.g., a reference component) or generated reference signal may be shared between components of the memory device 100 (e.g., shared among one or more sense components 150, shared among separate sensing circuits of a sense component 150, shared among access lines 120, 130, or 140 of a memory section 110).

In some memory architectures, accessing a memory cell 105 may degrade or destroy a logic state stored by one or more memory cells 105 of the memory section 110, and rewrite or refresh operations may be performed to return the original logic state to the memory cells 105. In architectures that include a material portion for logic storage, for example, sense operations may cause a change in the atomic configuration or distribution of a memory cell 105, thereby changing the resistance or threshold characteristics of the memory cell 105. Thus, in some examples, the logic state stored in a memory cell 105 may be rewritten after an access operation.

In some examples, reading a memory cell 105 may be non-destructive. That is, the logic state of the memory cell 105 may not need to be rewritten after the memory cell 105 is read. For example, in architectures that include a material portion for logic storage, sensing the memory cell 105 may not destroy the logic state and, thus, a memory cell 105 may not need rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write or refresh pulse or bias to maintain stored logic states. Refreshing a memory cell 105 may reduce or eliminate read disturb errors or logic state corruption due to a change in composition distribution of a logic storage material over time.

FIG. 2 illustrates an example of a circuit 200 that supports polarity-written cell architectures for a memory device in accordance with examples as disclosed herein. Components of the circuit 200 may be examples of the corresponding components described with reference to FIG. 1.

The circuit 200 may include a memory section 110-a including a set of memory cells 105-a (e.g., memory cells 105-a-11 through 105-a-mn), which may be illustrative of an array of memory cells 105 having m columns and n rows. Each of the memory cells 105-a may be coupled with a word line 205-a of the memory section 110-a (e.g., one of word lines 205-a-1 through 205-a-n), a bit line 210-a of the memory section 110-a (e.g., one of bit lines 210-a-1 through 210-a-m), and a source line 215-a of the memory section 110-a. Although illustrated as including a separate source line 215-a for each column of memory cells 105-a (e.g., a separate source line 215-a associated with each of the bit lines 210-a), in various examples, individual ones of the source lines 215-a may or may not be independently controlled or controllable. In some examples, the source lines 215-a-1 through 215-a-m may collectively be illustrative of a common node or common source of the circuit 200 (e.g., a common source plate).

Each of the word lines 205-a (e.g., each of the word lines $WL_1$ through $WL_n$) may be associated with a respective word line voltage $V_{WL}$ as illustrated, and may be coupled with a row component 125-a. The row component 125-a may couple one or more of the word lines 205-a with various voltage sources (not shown). For example, the row component 125-a may selectively couple one or more of the word lines 205-a with a voltage source having a relatively high voltage (e.g., a selection voltage, $V_{WL,H}$, which may be a voltage greater than 0V) or a voltage source having a relatively low voltage (e.g., a deselection voltage, $V_{WL,L}$, which may be a ground voltage of 0V, or a negative voltage).

Each of the bit lines 210-a (e.g., each of the bit lines $BL_1$ through $BL_m$) may be associated with a respective bit line voltage $V_{BL}$ as illustrated, and may be coupled with a sense component 150-a. In the example of circuit 200, each of the bit lines 210-a are illustrated as direct connections between the memory section 110-a and the sense component 150-a (e.g., directly coupling the memory section 110-a with the sense component 150-a). In other examples of circuits that support the described access schemes or operations, additional components or elements may be coupled with or between a memory section 110 and a sense component 150. In some examples, the sense component 150-a may selectively couple one or more of the bit lines 210-a with a voltage source having a relatively high voltage (e.g., a high bit line voltage, $V_{BL,H}$, which may be a voltage greater than 0V) or a voltage source having a relatively low voltage (e.g., a low bit line voltage, $V_{BL,L}$, which may be a ground voltage of 0V, or a negative voltage).

Each of the source lines 215-a (e.g., each of the source lines $SL_1$ through $SL_m$) may be associated with a respective source line voltage $V_{SL}$ as illustrated, and may be coupled with a source component 145-a. The source component 145-a may couple one or more source lines 215-a with various voltage sources (not shown). For example, the source component 145-a may selectively couple one or more source lines 215-a with a voltage source having a relatively high voltage (e.g., a source high voltage, $V_{SL,H}$, which may be a voltage greater than 0V) or a voltage source having a relatively low voltage (e.g., a source low voltage, $V_{SL,L}$, which may be a ground voltage of 0V, or a negative voltage).

According to the example illustrated by circuit 200, memory cells 105-a-11 through 105-a-1n may represent a set (e.g., a column) of memory cells 105-a of the memory section 110-a that are coupled with or between a bit line of the memory section 110-a (e.g., bit line 210-a-1) and a source line of the memory section 110-a (e.g., source line 215-a-1). Further, memory cells 105-a-m1 through 105-a-mn may represent a set (e.g., another column) of memory cells 105-a of the memory section 110-a that are coupled with or between a different bit line of the memory section 110-a (e.g., bit line 210-a-m) and a different source line of the memory section 110-a (e.g., source line 215-a-m).

According to the example illustrated by circuit 200, memory cells 105-*a*-11 through 105-*a*-*m*1 may represent a set (e.g., a row) of memory cells 105-*a* of the memory section 110-*a* that are coupled with a word line of the memory section 110-*a* (e.g., word line 205-*a*-1). Further, memory cells 105-*a*-1*n* through 105-*a*-*mn* may represent a set (e.g., another row) of memory cells 105-*a* of the memory section 110-*a* that are coupled with a different word line of the memory section 110-*a* (e.g., word line 205-*a*-*n*).

In the example of circuit 200, each of the memory cells 105-*a* include a respective material portion 220-*a* and a respective cell selection component 230-*a*. The plurality of memory cells 105-*a* may illustrate an example where each memory cell 105-*a* includes a material portion 220-*a* coupled with one of a first plurality of access lines (e.g., one of the source lines 215-*a*) and a cell selection component 230-*a* configured to selectively couple the material portion 220-*a* with one of a second plurality of access lines (e.g., one of the bit lines 210-*a*) based at least in part on a voltage of one of a third plurality of access lines (e.g., one of the word lines 205-*a*). In other words, the memory cells 105-*a* each include a material portion 220-*a* that is configured to be selectively coupled with, or isolated from, an access line (e.g., a bit line 210-*a*) in response to a signal (e.g., as carried by a word line 205-*a*). Although the memory cells 105-*a* are illustrated with material portions 220-*a* coupled with a source line 215-*a* and a cell selection component 230-*a* coupled with a bit line 210-*a*, the order of these components may be swapped in other examples of the described memory cell architectures such that a memory cell may include a material portion 220 coupled with a source line 215 and a cell selection component 230 coupled with a bit line.

In some examples, the material portions 220-*a* include a chalcogenide material. The chalcogenide material used in a material portion 220-*a* may, for example, be an alloy including selenium (Se), tellurium (Te), arsenic (As), antimony (Sb), carbon (C), germanium (Ge), or silicon (Si), or various combinations thereof. In some examples, a chalcogenide material having primarily selenium (Se), arsenic (As), and germanium (Ge) may be referred to as a SAG-alloy. In some examples, a SAG-alloy may include silicon (Si) and such chalcogenide material may be referred to as SiSAG-alloy. In some examples, a chalcogenide may include additional elements such as hydrogen (H), oxygen (O), nitrogen (N), chlorine (Cl), or fluorine (F), each in atomic or molecular forms. In some examples, some or all of the set of logic states supported by the memory cells 105-*a* may be associated with an amorphous state of the material portions 220-*a*.

In some examples, an electrode may be coupled with a material portion 220-*a* (e.g., between a material portion 220-*a* and a corresponding cell selection component 230-*a*, between a material portion 220-*a* and a corresponding source line 215). The term electrode may refer to an electrical conductor, or other electrical interface between components, and in some cases, may be employed as an electrical contact to a material portion 220-*a*. An electrode may include a trace, wire, conductive line, conductive layer, conductive pad, or the like, that provides a conductive path between elements or components of the circuit 200. In some examples, an electrode may be formed of a different material than a material portion 220-*a* and an interfacing component, which may reduce atomic diffusion or interaction between the material portion 220-*a* and an interfacing component, or may provide other benefits. For example, an electrode may be formed from a different material than a chalcogenide (e.g., carbon), and may prevent chemical interaction between the chalcogenide of a material portion 220-*a* and a source line 215-*a* or cell selection component 230-*a*. In some examples, the described electrodes may be omitted, such that the material portion 220-*a* may be in direct contact with, or otherwise formed of a material continuously with one or both of a source line 215-*a* or a cell selection component 230-*a*.

The material used in the material portions 220-*a* may be based on an alloy, such as the alloys listed above, and may be configured to avoid a phase change during normal operation of the circuit 200 (e.g., due to the composition of the chalcogenide material, due to operational voltages and currents configured to maintain the chalcogenide material in a single phase, such as an amorphous or glass phase). For example, the chalcogenide material may include a chemical element, such as arsenic, that inhibits crystallization of the chalcogenide material. Thus, the material portions 220-*a* may remain in an amorphous state during the operation of the circuit 200. In other words, some or all of the logic states that may be stored by the material portions 220-*a* may correspond to an amorphous state of the respective material portion 220-*a*.

The material portions 220-*a* may be configured to store one of a set of logic states based at least in part on a polarity of a write voltage applied to the material. A voltage polarity across a material portion 220-*a* may be described with reference to a corresponding first node 221-*a* and a second node 222-*a* of the material portion 220-*a*. In some examples, a positive voltage polarity across a material portion 220-*a* may refer to a condition where a voltage at a corresponding first node 221-*a* is higher than a voltage of a corresponding second node 222-*a*, and a negative voltage polarity across a material portion 220-*a* may refer to a condition where a voltage at a corresponding first node 221-*a* is lower than a voltage of a corresponding second node 222-*a*. However, different directions or orientations may be used to describe a voltage polarity applied to a material portion 220-*a*.

By way of example, and without limiting the disclosure or the claims to such a physical phenomenon or interpretation thereof, when a particular memory cell 105 is programmed, elements within the corresponding material portion 220-*a* may separate, causing ion or other compositional migration or anisotropy. In some examples, a write operation on a memory cell 105-*a* may result in a directional anisotropy of a corresponding material portion 220-*a* between a first node 221-*a* and a second node 222-*a* (e.g., along a direction between the first node 221-*a* and the second node 222-*a*). For example, ions or other constituents of a material portion 220-*a* may migrate towards a particular node, depending on the polarity of the write voltage applied to the memory cell 105-*a*. In some examples, certain constituents of a material portion 220-*a* may migrate towards the relatively negative electrode.

In some examples, compositional migration may be supported at least in part by applied heating of a material portion 220-*a*, which may be provided by ohmic heating resulting from a current through the material portion 220-*a*. In some examples, such current may be responsive to, or otherwise based at least in part on a write voltage (e.g., in a direction through the material that is based at least in part on the polarity of applied voltage). The compositional migration of the material portion 220-*a* may occur while the maintaining a largely amorphous atomic arrangement (e.g., a relatively random structural arrangement of molecules, as compared to a relatively ordered structural arrangement such as a crystalline arrangement). Although described in the context of compositional distributions or anisotropy in a material portion 220-*a* for distinguishing one logic state of a memory cell 105-a from another logic state, other mechanisms or material characteristics for storing logic states based on write operation polarity may support the described architectures for polarity-written memory cells 105-a.

Without limiting the disclosure or the claims to such a physical phenomenon or interpretation thereof, depending on the defined or configured directionality of the memory cell 105-a, a concentration of migrating ions towards one node or another may represent a logic "1" or logic "0" state. The memory cell 105-a may then be read by applying a voltage across the material portion 220-a to sense the logic state stored by the memory cell 105-a. In some examples, a threshold voltage (e.g., as experienced during a read operation) may be based on the distribution of ions in the material portion 220-a and the polarity of an applied read pulse. For example, if a material portion 220-a has a given distribution of ions, the threshold voltage detected during a read operation may be different for a first read pulse with a first polarity than it is with a second read pulse having a second polarity. In another example, rather than detecting a particular threshold voltage of a material portion 220-a, a voltage between predicted threshold voltages of different logic states may be applied in a read operation, and a presence or absence of current through the material portion 220-a may be used to detect whether the material portion 220-a was written with one polarity or another. It is to be understood that, whether a result of compositional distributions or anisotropy (e.g., ion migration, etc.) or any other underlying mechanism, aspects related to the writing (programming, inducing, imposing, configuring, or otherwise creating) and reading (detecting, determining, or otherwise observing) of different logic states based at least in part on different threshold voltages of a material and the application of voltages having different polarities may occur and be supported in accordance with the structures and techniques described herein. In various examples in accordance with the present disclosure, one or more other physical phenomenon may be relevant to logic states written to, or detected from the described memory cells 105, and the teachings herein may relate more generally to polarity-based memory cells and their operation, without limitation to any particular physical phenomena that may underlie the described behavior of such memory cells 105.

The row component 125-a, the sense component 150-a, and the source component 145-a may be configured to support various access operations (e.g., read operations, write operations, rewrite operations, refresh operations, and others) for the memory section 110-a. for example, the row component 125-a may be configured to select, activate, or otherwise apply a voltage to particular word lines 205-a. In some examples, selecting or activating a word line 205-a may select or activate the cell selection component 230-a for one or more of the memory cells 105-a that are coupled with the respective word line 205-a. For example, activating the word line 205-a-1 may select or activate all of the cell selection components 230-a-11 through 230-a-m1 associated with memory cells 105-a-11 through 105-a-m1 (e.g., a row of memory cells 105-a of the memory section 110-a). Although in some examples it may be advantageous to use n-channel transistors for the cell selection components 230-a, in various examples the cell selection components 230-a may include n-channel transistors, p-channel transistors, or other switching components, and the described operations for accessing a memory cell 105-a may be modified accordingly.

In some examples, the source component 145-a may be configured to select, activate, or otherwise apply a voltage to one or more of the source lines 215-a, and the sense component 150-a may be configured to select, activate, or otherwise apply a voltage to one or more of the bit lines 210-a. In some examples, the source component 145-a and the sense component 150-a may operate cooperatively to apply a voltage across particular memory cells 105-a according to a desired voltage magnitude or voltage polarity. In some examples, operations associated with the row component 125-a, the source component 145-a, or the sense component 150-a may be controlled at least in part by a memory controller 170 (not shown).

The sense component 150-a may include various components configured to detect a logic state stored by respective ones of the memory cells 105-a, which may be based at least in part on a current $I_{BL}$ flows along a respective bit line 210-a in response to a voltage applied across a memory cell 105-a (e.g., a voltage between a bit line 210-a and a source line 215-a). In some examples, the sense component 150-a may detect a stored logic state by comparing a current (e.g., a current $I_{BL}$) flowing along a respective bit line 210-a to a reference current or other threshold, or comparing a voltage associated with such a current (e.g., a voltage across a shunt resistor carrying a current $I_{BL}$) to a reference voltage or other threshold. In some examples, the sense component 150-a may detect a stored logic state by determining whether a memory cell 105-a (e.g., a material portion 220-a) has thresholded. For example, the sense component 150-a may be configured to detect when a material portion 220-a has undergone a change in resistance state, such as a breakdown from a high resistance state to a low resistance state.

The sense component 150-a may, in some examples, be used to latch signals associated with a read operation when detecting a logic state stored by memory cells 105-a. Electrical signals associated with such latching may be communicated between the sense component 150-a and an input/output component 160 (not shown). In some examples, the sense component 150-a may be in electronic communication with a memory controller (not shown), such as a memory controller 170 described with reference to FIG. 1, which may control various operations of the sense component 150-a.

The described architectures for memory cells 105-a may provide various advantages. For example, by including a material portion 220-a to store a logic state based on a material characteristic (e.g., a physical or compositional characteristic that may be written based at least in part on a write voltage polarity, such a compositional distribution or other anisotropy, or a difference in threshold characteristics), the memory portion 220-a may provide aspects of non-volatile storage that are not provided by capacitive or other charge-storage-based memory architectures.

As another example, maintaining the material portions 220-a in an amorphous state (e.g., a glass state, a relatively disordered molecular arrangement) for different logic states, the material portions 220-a may reduce the amount of heating (e.g., lower current) or time to write logic states. For example, changing the phase of a material (e.g., as in some phase change memory architectures) may demand enough current through a memory cell to form an amorphous state, whether the corresponding material was already in an amorphous state or was previously in a crystalline state. In one example, such phase change may call for in the range of 500-600 microamps of current, whereas a corresponding write operation of a memory cell 105-a may call for in the range of 20-30 microamps of current, which may be as low as a shutoff current (e.g., an $I_{hold}$) associated with a thresholding characteristic of the material portions 220-a.

The relatively high current of phase change operation and some related memory architectures may be a concern not only because of the related power consumption, but also because of the relatively large, high-capacity transistors that may be used for cell selection at such currents, and the related cost and layout limitations of such high-capacity (e.g., high voltage or current tolerance) transistors. In the case of the described architectures for polarity-written cells, the cell selection components 230-a may be significantly reduced, due to the relatively low currents associated with accessing the memory cells 105-a (e.g., when the material portions 220-a are maintained in an amorphous state).

As another example, forming different phases corresponding to different logic states may include, as part of a write operation, placing a material into an amorphous state and then controlling a rate of cooling of the material. In some examples, forming a crystalline state may include relatively slow cooling, and such an operation may not be required for writing a memory cell 105-a as described herein. Further, in some cases, the forming of different phases of a material may be associated with (e.g., may cause over time) degradation of the material, and thus, by avoiding such degradation (e.g., because the material portions 220-a remain in an amorphous state), the memory cells 105-a of the described memory architectures may be associated with improved endurance characteristics when compared to at least some memory architectures.

As another example, the inclusion of a cell selection component 230-a may support the material portions 220-a being designed or configured to operate with lower access voltages (e.g., for read operations or write operations) than if cell selection component 230-a was not present (e.g., as in some phase change or other memory architectures). For example, memory architectures without a dedicated selection component (e.g., separate from a storage component) may need to consider leakage current through non-target memory cells (e.g., non-target memory cells sharing an activated access line with a target memory cell), or inadvertent selection of a non-target cell (e.g., due to thresholding of a non-target cell) where such leakage or inadvertent selection currents may be indeterminate from a current through a target cell used for sensing a stored logic state. Further, such memory architectures may also need to consider possible effects of logic state degradation in non-target memory cells. Thus, to support operable read or write margins, such self-selecting memory architectures may command relatively high voltages (e.g., in the range of 10 V) for certain access operations (e.g., for writing a material portion with self-selecting properties and logic storage properties). Accordingly, such self-selecting memory architectures may command special-purpose voltage sources or other circuitry, which may be associated with elevated costs or power consumption.

In the described architecture for polarity-written memory cells 105-a, cell selection components 230-a may be used to selectively couple or isolate material portions 220-a. Such an architecture may reduce or eliminate leakage currents or inadvertent selection or thresholding that would otherwise be associated with non-target memory cells 105-a, and may also reduce sensitivity to degradation of stored logic states (e.g., resulting from access voltages associated with other target memory cells 105-a that share a common source line 215 or bit line 210). Thus, the memory cells 105-a may support suitable read or write margins (e.g., a positive read window budget) at relatively low voltages for access operations, such as voltages in the range of 3V across the memory cells 105-a, and even as low as 1 V (e.g., for biasing word lines 205-a, for activating cell selection components 230-a). In other words, the material portions 220-a may be engineered for a relatively low threshold voltage (e.g., Vt.') of the material portions 220-a to support relatively low-voltage operation, while the cell selection components 230-a may be used (e.g., via array decoding) to selectively isolate non-target memory cells to reduce or eliminate leakage currents or inadvertent thresholding of non-target memory cells 105-a that would otherwise lead to difficulties in resolving or detecting a logic state stored by a target memory cell 105-a. Thus, the memory cells 105-a may be operated in a manner that avoids, or otherwise does not rely (at least not exclusively) on a self-selecting behavior of a memory material. In some applications, such as embedded applications, such an arrangement may support the circuit 200 using the same voltage sources as other components of the embedded application, such as voltage sources used by a microcontroller or other processing circuit of the embedded application.

Thus, for these and other reasons, a memory cell 105-a that includes the described combination of a material portion 220-a and a cell selection component 230-a may provide particular advantages over other known memory architectures.

Although the memory section 110-a, the memory cells 105-a, and the cell selection components 230-a are illustrated with respective dashed lines as reflecting particular boundaries, such boundaries are shown for illustrative purposes only. In other words, one or more of the memory section 110-a, the memory cells 105-a, or the cell selection components 230-a may have boundaries different than the dashed boundaries shown in the circuit 200, and accordingly may include more or fewer components than illustrated in the example of FIG. 2.

Figure 3:
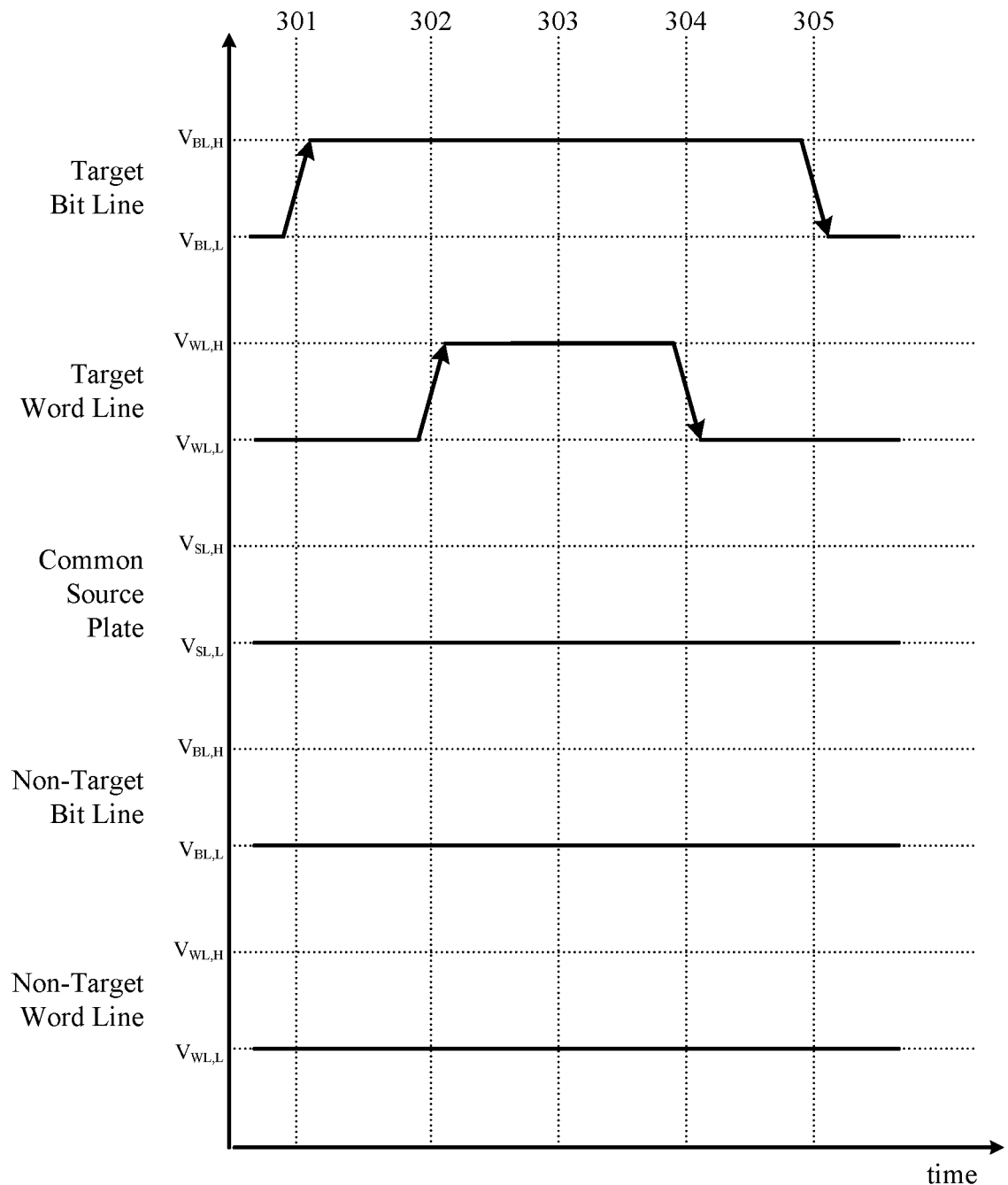
FIG. 3 illustrates an example of a timing diagram that supports polarity-written cell architectures for a memory device in accordance with examples as disclosed herein.

FIG. 3 illustrates an example of a timing diagram 300 that supports polarity-written cell architectures for a memory device in accordance with examples as disclosed herein. The timing diagram may be performed by a memory device, such as memory device 100 described with reference to FIG. 1. The timing diagram 300 is described with reference to components of the example circuit 200 described with reference to FIG. 2, but may be illustrative of operations that may be performed with different circuit arrangements as well. In the example of timing diagram 300, the circuit 200 may be an example where the source lines 215-a represent a common node (e.g., where source lines 215-a-1 through 215-a-m represent a common source plate, or have a common connection point at the source component 145-a, or are otherwise electrically equivalent, as in a common electrical node). Thus, references to source lines 215-a of the timing diagram 300 may refer to operations applied to all of the source lines 215-a of the circuit 200 collectively (e.g., as a common electrical node, a common biasing).

In the example of timing diagram 300, the memory cell 105-a-11 may be selected for an access operation (e.g., prior to the operations of timing diagram 300). Thus, the memory cell 105-a-11 may be a target memory cell, whereas other memory cells 105-a of the circuit 200 (e.g., memory cells 105-a-12 through 105-a-1n of the same column as the target memory cell 105-a-11, memory cells 105-a-21 through 105-a-m1 of the same row as the target memory cell 105-a-11, memory cells 105-a-22 through 105-a-mn that do not share an access line with the target memory cell 105-a-11) may be non-target memory cells. In various examples, the target memory cell 105-a-11 may be selected for a write operation, a read operation, a rewrite operation, a refresh operation, or other access operation, and aspects of operations (e.g., relative timings, durations, voltage levels) illustrated by the timing diagram 300 may be adjusted accordingly.

The timing diagram 300 is described with reference to biasing of word lines 205-a, bit lines 210-a, and source lines 215-a. Word lines 205-a, for example, may be selectively biased with a relatively lower voltage (e.g., $V_{WL,L}$, which may be a ground voltage) or a relatively higher voltage (e.g., $V_{WL,H}$, which may be a voltage selected to selectively activate cell selection components 230-a, such as a voltage applied to a gate of an n-type transistor of a cell selection component 230-a that is above a threshold voltage of the transistor). Bit lines 210-a, for example, may be selectively biased with a relatively lower voltage (e.g., $V_{BL,L}$, which may be a ground voltage) or a relatively higher voltage (e.g., $V_{BL,H}$, which may be a voltage chosen to write a particular logic state to target memory cells 105-a, or a voltage chosen to identify a logic state stored by target memory cells 105-a, as in a read operation). The commonly-biased source lines 215-a, for example, may be selectively biased with a relatively lower voltage (e.g., $V_{SL,L}$, which may be a ground voltage) or a relatively higher voltage (e.g., $V_{SL,H}$, which may be a voltage chosen to write a particular logic state to target memory cells 105-a, or a voltage chosen to identify a logic state stored by target memory cells 105-a, as in a read operation).

Prior to the operations of timing diagram 300, all of the word lines 205-a, the bit lines 210-a, and the source lines 215-a may be biased to a low level, or deactivated state. In some examples, prior to the operations of the timing diagram 300, the circuit 200 may be in a standby state, or a transition period following a preceding access operation. In other examples, any one or more of the word lines 205-a, the bit lines 210-a, or the source lines 215-a may be biased to a different level, which, in some cases, may be a final condition of a preceding access operation.

At 301, the target bit line 210-a (e.g., bit line 210-a-1, a target column) may be biased to a relatively higher voltage (e.g., $V_{BL,H}$). As a result of the operations of 301, the memory cells 105-a of the target column (e.g., memory cells 105-a-11 through 105-a-1n) may be biased with a voltage (e.g., a voltage difference between the target bit line 210-a-1 and the source line 215-a-1, equal to $V_{BL,H}-V_{SL,L}$). However, because the cell selection components 230-a along the column associated with the target bit line 210-a (e.g., cell selection components 230-a-11 through 230-a-1n) are not activated, current may not flow across the target memory cell 105-a or other memory cells 105-a in the target column. In other words, despite the voltage difference between the target bit line 210-a and the source line 215-a, current may not flow across memory cells 105-a of the activated column (e.g., memory cells 105-a-11 through 105-a-1n) at 301. Further, as a result of isolation provided by the deactivated target cell selection components 230-a of the target bit line 210-a, the corresponding first nodes 221-a may not rise to the voltage of the target bit line 210-a (e.g., first nodes 221-a-11 through 221-a-1n may not be at $V_{BL,H}$ at 301).

At 302, the target word line 205-a (e.g., word line 205-a-1, a target row) may be biased to a relatively higher voltage (e.g., $V_{WL,H}$). As a result of the operations of 302, one or more of the cell selection components 230-a of the target row (e.g., each of the cell selection components 230-a-11 through 230-a-m1) may be activated. Thus, the first nodes 221-a of the target row may be selectively coupled with a corresponding bit line 210-a (e.g., first node 221-a-11 may be selectively coupled with bit line 210-a-1, first node 221-a-12 may be selectively coupled with bit line 210-a-2, and so on), which may permit current to flow through the respective memory cells 105-a of the target row. However, in this case, current may not flow through non-target memory cells 105-a of the target row (e.g., memory cells 105-a-21 through 105-a-m1) because there may not be a voltage applied across the non-target memory cells 105-a (e.g., because the corresponding non-target bit lines 210-a may be at a voltage $V_{BL,L}$, the source lines 215-a may be at a voltage $V_{SL,L}$, and $V_{BL,L}$ may be the same as $V_{SL,L}$). Further, because cell selection components 230-a of non-target memory cells along the target bit line 210-a (e.g., cell selection components 230-a-12 through 230-a-1n) remain deactivated (e.g., because non-target word lines 205-a-2 through 205-a-n remain at a deselected voltage, $V_{WL,L}$), current may still be inhibited across the non-target memory cells 105-a of the target column (e.g., current may be inhibited across memory cells 105-a-12 through 105-a-1n).

At 303, an access operation may be performed on the target memory cell 105-a-11. Although described with respect to a particular time (e.g., at 303), the described access operation may occur over various durations between 302 and 304 (e.g., as a voltage difference is developed across the material portion 220-a-11, over a duration during which a voltage difference is maintained across the material portion 220-a-11).

In one example, when the target memory cell 105-a-11 has been selected for a write operation, the voltage difference across the material portion 220-a-11 (e.g., $V_{BL,H}-V_{SL,L}$) may be selected to have a magnitude that is high enough to write a desired logic state. In some examples, the voltage difference across the material portion 220-a-11 may be selected to be higher than a threshold voltage of the material portion 220-a-11, regardless of the previously stored logic state. In other words, the magnitude of the voltage difference across the material portion 220-a-11 may be higher than the respective threshold voltages of the material portion 220-a-11 for each of logic states that may be stored by the material portion 220-a-11. Accordingly, to support a write operation at 303, the voltage difference across the material portion 220-a-11 may be configured drive a current across the material portion 220-a-11. In the example of timing diagram 300, the voltage across the material portion 220-a-11 may have a positive polarity (e.g., where a voltage at the first node 221-a-11 is higher than a voltage at the second node 222-a-11), which may be associated with writing a particular logic state (e.g., a logic state different than a logic state that would be written with a negative polarity).

In the example of a write operation, the non-target memory cells 105-a of the target column may be less susceptible to disturbance (e.g., degradation of a stored logic state) at 303 using the described architecture for memory cells than other architectures. For example, although a voltage difference is applied across the non-target memory cells 105-a (e.g., $V_{BL,H}-V_{SL,L}$), current flow through the non-target memory cells 105-a may be blocked or otherwise inhibited by the deactivated cell selection components 230-a of the non-target memory cells 105-a according to the described architecture.

In another example, when the target memory cell 105-a-11 has been selected for a read operation, the voltage difference across the material portion 220-a-11 (e.g., $V_{BL,H}-V_{SL,L}$) may be selected to have a magnitude that is between threshold voltages of logic states that may be stored by the material portion 220-a-11. For example, to support a read operation at 303, the voltage difference across the material portion 220-a-11 may be configured with a magnitude that is greater than a threshold voltage of a first logic state (e.g., as written with a first voltage polarity), but below a threshold voltage of a second logic state (e.g., as written with a second voltage polarity different than the first voltage polarity). Thus, when the timing diagram 300 illustrates a read operation, a presence or absence of current across the target memory cell 105-*a*-11 (e.g., a presence or absence of a current along the target bit line 210-*a*-1, as detected at the sense component 150-*a*) at 303 may be used to determine whether the target memory cell 105-*a*-11 stored the first logic state or the second logic state. In examples where the voltage across the material portion 220-*a*-11 has a positive polarity (e.g., where a voltage at the first node 221-*a*-11 is higher than a voltage at the second node 222-*a*-11), the operations of 303 may illustrate a read operation with a positive voltage polarity.

In the example of a read operation, the detection of the stored logic state of the memory cell 105-*a*-11 may be improved by the described architecture for memory cells because current through non-target memory cells 105-*a* of the target column may be blocked or otherwise inhibited by the deactivated cell selection components 230-*a* of the non-target memory cells, thereby blocking or otherwise inhibiting leakage current or inadvertent thresholding of the non-target memory cells 105-*a*. Thus, by blocking or otherwise inhibiting current through non-target memory cells 105-*a*, the current detected by the sense component (e.g., $I_{BL,1}$) may be more representative of the current flowing through the target memory cell 105-*a*-11, which may improve read margins as compared to architectures where leakage or inadvertent thresholding is not inhibited by such a cell selection component 230-*a*.

At 304, the target word line 205-*a* (e.g., word line 205-*a*-1) may be biased to a relatively lower voltage (e.g., $V_{WL,L}$). As a result of the operations of 304, one or more of the cell selection components 230-*a* of the target row (e.g., each of the cell selection components 230-*a*-11 through 230-*a*-*m*1) may be deactivated. Thus, the first nodes 221-*a* of the target row may be selectively isolated from a corresponding bit line 210-*a* (e.g., first node 221-*a*-11 may be selectively isolated from bit line 210-*a*-1, first node 221-*a*-12 may be selectively isolated from bit line 210-*a*-2, and so on), which may inhibit current from flowing through the respective memory cells 105-*a* of the target row.

At 305, the target bit line 210-*a* (e.g., bit line 210-*a*-1) may be biased to a relatively lower voltage (e.g., $V_{BL,L}$). As a result of the operations of 305, the memory cells 105-*a* of the target column (e.g., memory cells 105-*a*-11 through 105-*a*-1*n*) may be biased with a voltage equal to $V_{BL,L}$-$V_{SL,L}$, which, in some examples, may be a zero bias (e.g., when $V_{BL,L}$ equals $V_{SL,L}$). In some examples, at 305 each of the word lines 205-*a*, bit lines 210-*a*, and source lines 215-*a* may be grounded or otherwise commonly biased.

The order of operations shown in the timing diagram 300 is for illustration only, and various other orders and combinations of steps may be performed in accordance with the present disclosure. For example, the relative order of operations of 301 and 302 may be swapped, or the operations of 301 and 302 may occur at the same time or during overlapping intervals. Additionally or alternatively, the relative order of operations of 304 and 305 may be swapped, or the operations of 304 and 305 may occur at the same time or during overlapping intervals.

Further, the timing of the operations of the timing diagram 300 is also for illustration purposes only, and is not meant to indicate a particular relative duration between one operation and another. For example, although the target bit line is illustrated as being activated over a longer duration than the target word line is activated, in some examples, a target word line may be activated over a longer duration than a target bit line. In another example, the operations of 301 and 302 may be relatively closely spaced in time, and the operations of 304 and 305 may be relatively closely spaced in time, whereas the operations of 302 and 304 may be spaced relatively far in time (e.g., to support read or write operations or responses occurring based on the difference in voltage between the target bit line and the common source plate). Further, although operations of the timing diagram 300 are described with reference to a point in time, the operations, or responses to such operations, may occur over various durations in time. Various operations may occur over a duration or time interval that is relatively shorter or relatively longer than illustrated in various examples of polarity-written cell architectures for a memory device in accordance with the present disclosure.

Figure 4:
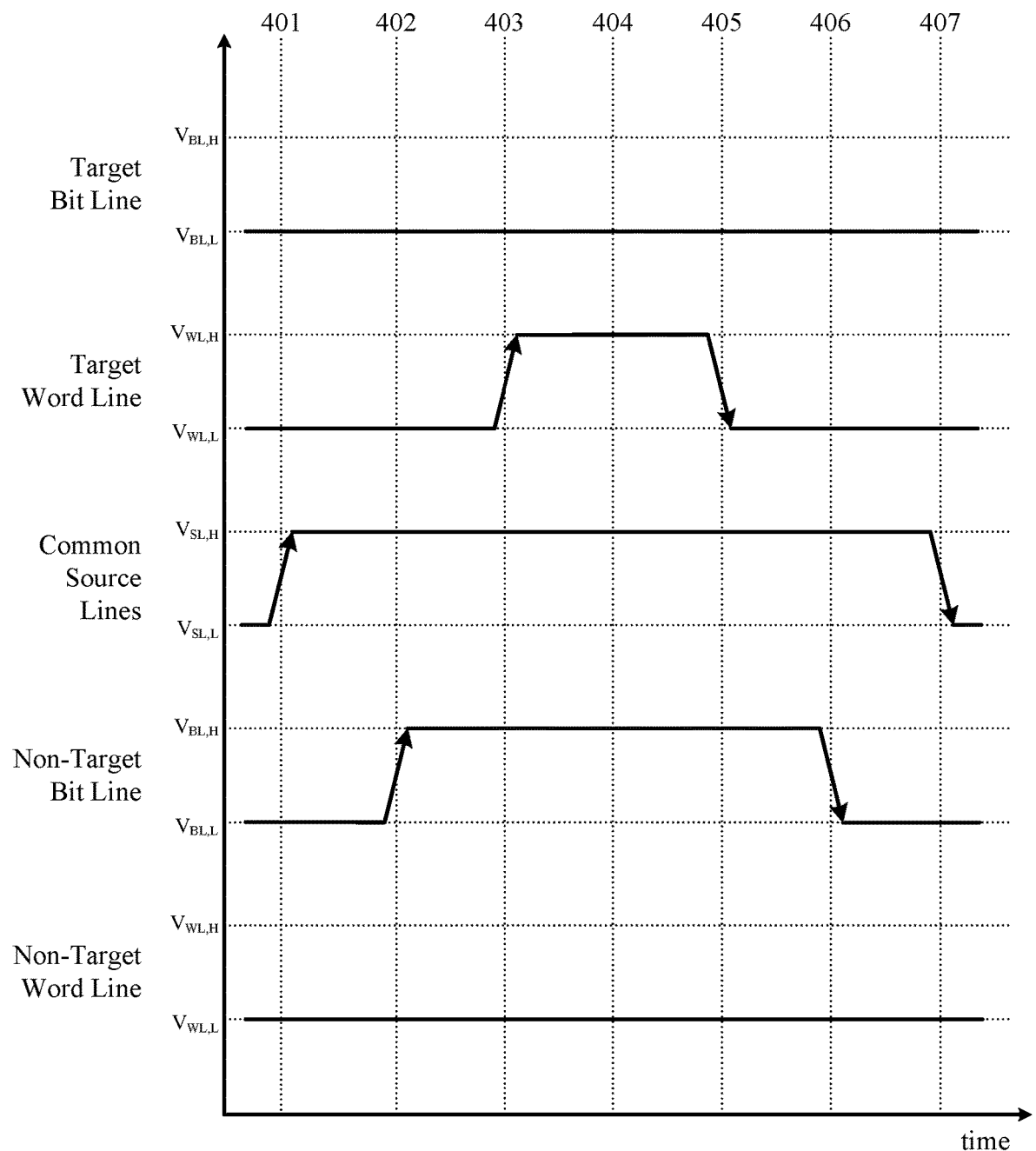
FIG. 4 illustrates an example of a timing diagram that supports polarity-written cell architectures for a memory device in accordance with examples as disclosed herein.

FIG. 4 illustrates an example of a timing diagram 400 that supports polarity-written cell architectures for a memory device in accordance with examples as disclosed herein. The timing diagram may be performed by a memory device, such as memory device 100 described with reference to FIG. 1. The timing diagram 400 is described with reference to components of the example circuit 200 described with reference to FIG. 2, but may be illustrative of operations that may be performed with different circuit arrangements as well. In the example of timing diagram 400, the circuit 200 may be an example where the source lines 215-*a* represent a common node (e.g., where source lines 215-*a*-1 through 215-*a*-*m* represent a common source plate, or have a common connection point at the source component 145-*a*, or are otherwise electrically equivalent, as in a common electrical node). Thus, references to source lines 215-*a* of the timing diagram 400 may refer to operations applied to all of the source lines 215-*a* of the circuit 200 collectively (e.g., as a common electrical node, a common biasing).

In the example of timing diagram 400, the memory cell 105-*a*-11 may be selected for an access operation (e.g., prior to the operations of timing diagram 400). Thus, the memory cell 105-*a*-11 may be a target memory cell, whereas other memory cells 105-*a* of the circuit 200 (e.g., memory cells 105-*a*-12 through 105-*a*-1*n* of the same column as the target memory cell 105-*a*-11, memory cells 105-*a*-21 through 105-*a*-*m*1 of the same row as the target memory cell 105-*a*-11, memory cells 105-*a*-22 through 105-*a*-*mn* that do not share an access line with the target memory cell 105-*a*-11) may be non-target memory cells. In various examples, the target memory cell 105-*a*-11 may be selected for a write operation, a read operation, a rewrite operation, a refresh operation, or other access operation, and aspects of operations (e.g., relative timings, durations, voltage levels) illustrated by the timing diagram 400 may be adjusted accordingly.

The timing diagram 400 is described with reference to biasing of word lines 205-*a*, bit lines 210-*a*, and source lines 215-*a*. Word lines 205-*a*, for example, may be selectively biased with a relatively lower voltage (e.g., $V_{WL,L}$, which may be a ground voltage) or a relatively higher voltage (e.g., $V_{WL,H}$, which may be a voltage selected to selectively activate cell selection components 230-*a*, such as a voltage applied to a gate of an n-type transistor of a cell selection component 230-*a* that is above a threshold voltage of the transistor). Bit lines 210-*a*, for example, may be selectively biased with a relatively lower voltage (e.g., $V_{BL,L}$, which may be a ground voltage) or a relatively higher voltage (e.g., $V_{BL,H}$, which may be a voltage chosen to write a particular logic state to target memory cells 105-*a*, or a voltage chosen to identify a logic state stored by target memory cells 105-*a*, as in a read operation). The commonly-biased source lines 215-*a*, for example, may be selectively biased with a relatively lower voltage (e.g., $V_{SL,L}$, which may be a ground voltage) or a relatively higher voltage (e.g., $V_{SL,H}$, which may be a voltage chosen to write a particular logic state to target memory cells 105-*a*, or a voltage chosen to identify a logic state stored by target memory cells 105-*a*, as in a read operation).

Prior to the operations of timing diagram 400, all of the word lines 205-*a*, the bit lines 210-*a*, and the source lines 215-*a* may be biased to a low level, or deactivated state. In some examples, prior to the operations of the timing diagram 400, the circuit 200 may be in a standby state, or a transition period following a preceding access operation. In other examples, any one or more of the word lines 205-*a*, the bit lines 210-*a*, or the source lines 215-*a* may be biased to a different level, which, in some cases, may be a final condition of a preceding access operation.

At 401, the source lines 215-*a* (e.g., source lines 215-*a*-1 through 215-*a*-*m*, a common source plate) may be biased to a relatively higher voltage (e.g., $V_{SL,H}$). As a result of the operations of 401, all of the memory cells 105-*a* (e.g., memory cells 105-*a*-11 through 105-*a*-*mn*) may be biased with a voltage (e.g., a voltage difference between each of the bit line 210-*a*-1 through 210-*a*-*m* and the source lines 215-*a*-1 through 215-*a*-*m*, equal to $V_{BL,L}$-$V_{SL,H}$). However, because the cell selection components 230-*a* (e.g., cell selection components 230-*a*-11 through 230-*a*-*mn*) are not activated, current may not flow across the target memory cell 105-*a* or other memory cells 105-*a*. In other words, despite the voltage difference between the bit lines 210-*a* and the source lines 215-*a*, current may not flow across memory cells 105-*a* (e.g., memory cells 105-*a*-11 through 105-*a*-*mn*) at 401.

At 402, the non-target bit lines 210-*a* (e.g., bit lines 210-*a*-2 through 210-*a*-*m*) may be biased to a relatively higher voltage (e.g., $V_{BL,H}$). As a result of the operations of 402, the memory cells 105-*a* of the target column (e.g., memory cells 105-*a*-11 through 105-*a*-1*n*) may remain biased with a voltage (e.g., a voltage difference between the target bit line 210-*a*-1 and the source line 215-*a*-1, equal to $V_{BL,L}$-$V_{SL,H}$). However, because the cell selection components 230-*a* along the column associated with the target bit line 210-*a* (e.g., cell selection components 230-*a*-11 through 230-*a*-1*n*) remain deactivated, current may not flow across the target memory cell 105-*a* or other memory cells 105-*a* in the target column. In other words, despite the voltage difference between the target bit line 210-*a* and the source line 215-*a*, current may not flow across memory cells 105-*a* of the activated column (e.g., memory cells 105-*a*-11 through 105-*a*-1*n*) at 401. As a further result of the operations of 402, the memory cells 105-*a* of the non-target columns (e.g., memory cells 105-*a*-21 through 105-*a*-*mn*) may be biased with a voltage equal to $V_{BL,H}$-$V_{SL,H}$, which, in some examples, may be a zero bias (e.g., when $V_{BL,H}$ equals $V_{SL,H}$).

At 403, the target word line 205-*a* (e.g., word line 205-*a*-1, a target row) may be biased to a relatively higher voltage (e.g., $V_{WL,H}$). As a result of the operations of 403, one or more of the cell selection components 230-*a* of the target row (e.g., each of the cell selection components 230-*a*-11 through 230-*a*-*m*1) may be activated. Thus, the first nodes 221-*a* of the target row may be selectively coupled with a corresponding bit line 210-*a* (e.g., first node 221-*a*-11 may be selectively coupled with bit line 210-*a*-1, first node 221-*a*-12 may be selectively coupled with bit line 210-*a*-2, and so on), which may permit current to flow through the respective memory cells 105-*a* of the target row. However, in this case, current may not flow through non-target memory cells 105-*a* of the target row (e.g., memory cells 105-*a*-21 through 105-*a*-*m*1) because there may not be a voltage applied across the non-target memory cells 105-*a* (e.g., because the corresponding non-target bit lines 210-*a* may be at a voltage $V_{BL,H}$, the source lines 215-*a* may be at a voltage $V_{SL,H}$, and $V_{BL,H}$ may be the same as $V_{SL,H}$). Further, because cell selection components 230-*a* of non-target memory cells along the target bit line 210-*a* (e.g., cell selection components 230-*a*-12 through 230-*a*-1*n*) remain deactivated (e.g., because non-target word lines 205-*a*-2 through 205-*a*-*n* remain at a deselected voltage, $V_{WL,L}$), current may still be inhibited across the non-target memory cells 105-*a* of the target column (e.g., current may be inhibited across memory cells 105-*a*-12 through 105-*a*-1*n*).

At 404, an access operation may be performed on the target memory cell 105-*a*-11. Although described with respect to a particular time (e.g., at 404), the described access operation may occur over various durations between 403 and 405 (e.g., as a voltage difference is developed across the material portion 220-*a*-11, over a duration during which a voltage difference is maintained across the material portion 220-*a*-11).

In one example, when the target memory cell 105-*a*-11 has been selected for a write operation, the voltage difference across the material portion 220-*a*-11 (e.g., $V_{BL,L}$-$V_{SL,H}$) may be selected to have a magnitude that is high enough to write a desired logic state. In some examples, the voltage difference across the material portion 220-*a*-11 may be selected to be higher than a threshold voltage of the material portion 220-*a*-11, regardless of the previously stored logic state. In other words, the magnitude of the voltage difference across the material portion 220-*a*-11 may be higher than the respective threshold voltages of the material portion 220-*a*-11 for each of logic states that may be stored by the material portion 220-*a*-11. Accordingly, to support a write operation at 403, the voltage difference across the material portion 220-*a*-11 may be configured drive a current across the material portion 220-*a*-11. In the example of timing diagram 400, the voltage across the material portion 220-*a*-11 may have a negative polarity (e.g., where a voltage at the first node 221-*a*-11 is lower than a voltage at the second node 222-*a*-11), which may be associated with writing a particular logic state (e.g., a logic state different than a logic state that would be written with a positive polarity, a logic state different than a logic state that would be written according to the timing diagram 300).

In the example of a write operation, the non-target memory cells 105-*a* of the target column may be less susceptible to disturbance (e.g., degradation of a stored logic state) at 404 using the described architecture for memory cells than other architectures. For example, although a voltage difference is applied across the non-target memory cells 105-*a* (e.g., $V_{BL,L}$-$V_{SL,H}$), current flow through the non-target memory cells 105-*a* may be blocked or otherwise inhibited by the deactivated cell selection components 230-*a* of the non-target memory cells 105-*a* according to the described architecture.

In another example, when the target memory cell 105-*a*-11 has been selected for a read operation, the voltage difference across the material portion 220-*a*-11 (e.g., $V_{BL,L}$-$V_{SL,H}$) may be selected to have a magnitude that is between threshold voltages of logic states that may be stored by the material portion 220-*a*-11. For example, to support a read operation at 404, the voltage difference across the material portion 220-a-11 may be configured with a magnitude that is greater than a threshold voltage of a first logic state (e.g., as written with a first voltage polarity), but below a threshold voltage of a second logic state (e.g., as written with a second voltage polarity different than the first voltage polarity) (which may be a same or a different threshold voltages when compared to the operations of the timing diagram 300 when performed in a read operation). Thus, when the timing diagram 400 illustrates a read operation, a presence or absence of current across the target memory cell 105-a-11 (e.g., a presence or absence of a current along the target bit line 210-a-1, as detected at the sense component 150-a) at 404 may be used to determine whether the target memory cell 105-a-11 stored the first logic state or the second logic state. In examples where the voltage across the material portion 220-a-11 has a negative polarity (e.g., where a voltage at the first node 221-a-11 is lower than a voltage at the second node 222-a-11), the operations of 403 may illustrate a read operation with a negative voltage polarity.

In the example of a read operation, the detection of the stored logic state of the memory cell 105-a-11 may be improved by the described architecture for memory cells because current through non-target memory cells 105-a of the target column may be blocked or otherwise inhibited by the deactivated cell selection components 230-a of the non-target memory cells, thereby blocking or otherwise inhibiting leakage current or inadvertent thresholding of the non-target memory cells 105-a. Thus, by blocking or otherwise inhibiting current through non-target memory cells 105-a, the current detected by the sense component (e.g., $I_{BL,1}$) may be more representative of the current flowing through the target memory cell 105-a-11, which may improve read margins as compared to architectures where leakage or inadvertent thresholding is not inhibited by such a cell selection component 230-a.

At 405, the target word line 205-a (e.g., word line 205-a-1) may be biased to a relatively lower voltage (e.g., $V_{WL,L}$). As a result of the operations of 405, one or more of the cell selection components 230-a of the target row (e.g., each of the cell selection components 230-a-11 through 230-a-m1) may be deactivated. Thus, the first nodes 221-a of the target row may be selectively isolated from a corresponding bit line 210-a (e.g., first node 221-a-11 may be selectively isolated from bit line 210-a-1, first node 221-a-12 may be selectively isolated from bit line 210-a-2, and so on), which may inhibit current from flowing through the respective memory cells 105-a of the target row.

At 406, the non-target bit lines 210-a (e.g., bit line 210-a-2 through 210-a-m) may be biased to a relatively lower voltage (e.g., $V_{BL,L}$). At 407, the source lines 215-a (e.g., source lines 215-a-1 through 210-a-m, a common source plate) may be biased to a relatively lower voltage (e.g., $V_{SL,L}$). As a result of the operations of 406 and 407, the memory cells 105-a of the circuit 200 (e.g., memory cells 105-a-11 through 105-a-mn) may be biased with a voltage equal to $V_{BL,L}$-$V_{SL,L}$, which, in some examples, may be a zero bias (e.g., when $V_{BL,L}$ equals $V_{SL,L}$). In some examples, at 407 each of the word lines 205-a, bit lines 210-a, and source lines 215-a may be grounded or otherwise commonly biased.

The order of operations shown in the timing diagram 400 is for illustration only, and various other orders and combinations of steps may be performed in accordance with the present disclosure. For example, the relative order of operations of 401 and 402 may be swapped, or the operations of 401 and 402 may occur at the same time or during overlapping intervals. Additionally or alternatively, the relative order of operations of 406 and 407 may be swapped, or the operations of 406 and 407 may occur at the same time or during overlapping intervals.

Further, the timing of the operations of the timing diagram 400 is also for illustration purposes only, and is not meant to indicate a particular relative duration between one operation and another. For example, although the common source lines 215-a are illustrated as being activated over a longer duration than the non-target bit lines 210-a, in some examples, the non-target bit lines 210-a may be activated over a longer duration than the common source lines 215-a. In another example, the operations of 401, 402, or 403 may be relatively closely spaced in time, and the operations of 405, 406, and 407 may be relatively closely spaced in time, whereas the operations of 403 and 405 may be spaced relatively far in time (e.g., to support read or write operations or responses occurring based on the difference in voltage between the target bit line and the common source plate). Further, although operations of the timing diagram 400 are described with reference to a point in time, the operations, or responses to such operations, may occur over various durations in time. Various operations may occur over a duration or time interval that is relatively shorter or relatively longer than illustrated in various examples of polarity-written cell architectures for a memory device in accordance with the present disclosure.

Figure 5:
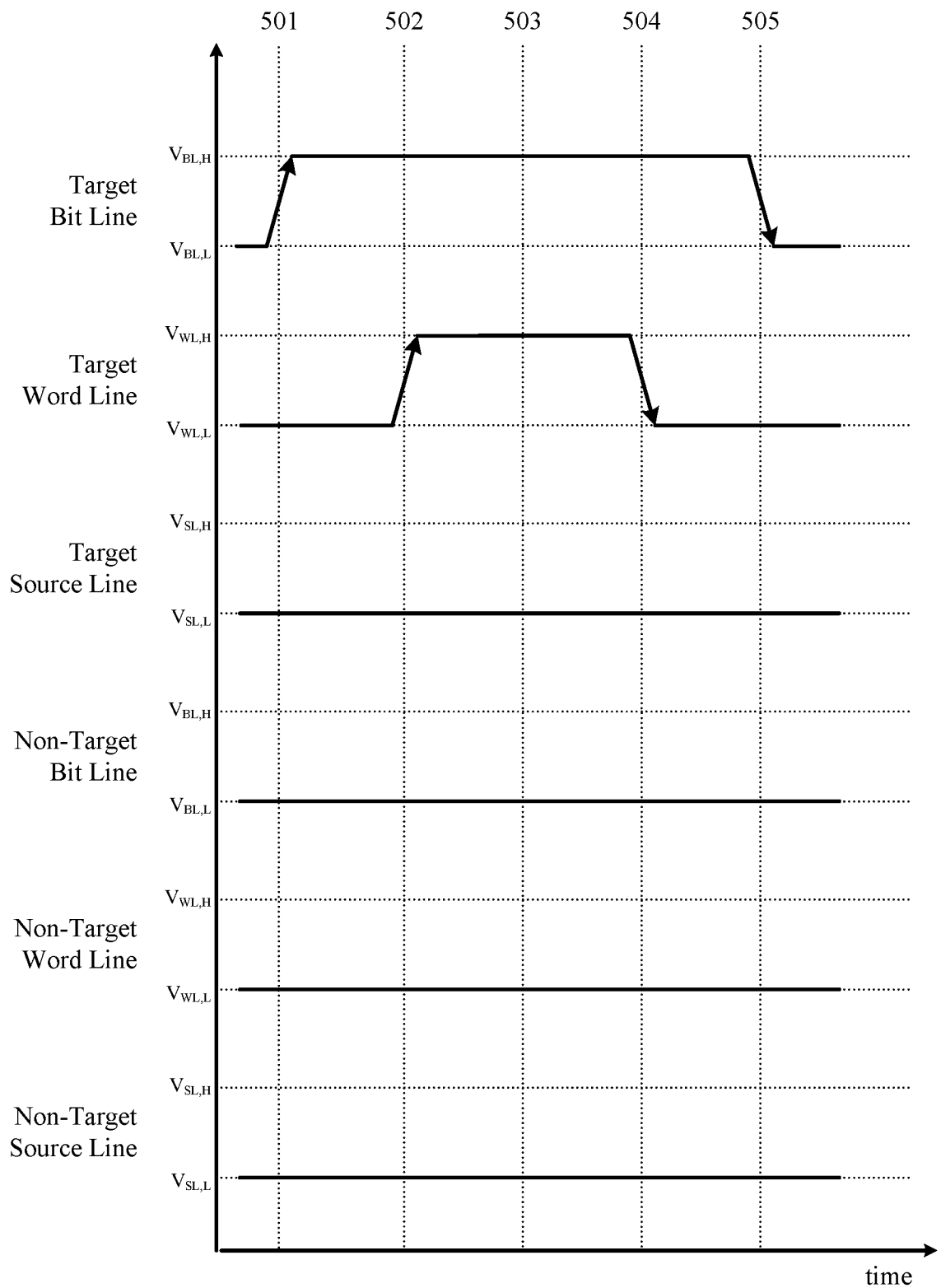
FIG. 5 illustrates an example of a timing diagram that supports polarity-written cell architectures for a memory device in accordance with examples as disclosed herein.

FIG. 5 illustrates an example of a timing diagram 500 that supports polarity-written cell architectures for a memory device in accordance with examples as disclosed herein. The timing diagram may be performed by a memory device, such as memory device 100 described with reference to FIG. 1. The timing diagram 500 is described with reference to components of the example circuit 200 described with reference to FIG. 2, but may be illustrative of operations that may be performed with different circuit arrangements as well. In the example of timing diagram 500, the circuit 200 may be an example where the source lines 215-a are independently controllable (e.g., where source line 215-a-1 may be biased independently from, or at a different voltage than source lines 215-a-2 through 215-a-m). Thus, references to source lines 215-a of the timing diagram 500 may refer to operations applied to a target source line 215-a versus a non-target source line 215-a.

In the example of timing diagram 500, the memory cell 105-a-11 may be selected for an access operation (e.g., prior to the operations of timing diagram 500). Thus, the memory cell 105-a-11 may be a target memory cell, whereas other memory cells 105-a of the circuit 200 (e.g., memory cells 105-a-12 through 105-a-1n of the same column as the target memory cell 105-a-11, memory cells 105-a-21 through 105-a-m1 of the same row as the target memory cell 105-a-11, memory cells 105-a-22 through 105-a-mn that do not share an access line with the target memory cell 105-a-11) may be non-target memory cells. In various examples, the target memory cell 105-a-11 may be selected for a write operation, a read operation, a rewrite operation, a refresh operation, or other access operation, and aspects of operations (e.g., relative timings, durations, voltage levels) illustrated by the timing diagram 500 may be adjusted accordingly.

The timing diagram 500 is described with reference to biasing of word lines 205-a, bit lines 210-a, and source lines 215-a. Word lines 205-a, for example, may be selectively biased with a relatively lower voltage (e.g., $V_{WL,L}$, which may be a ground voltage) or a relatively higher voltage (e.g., $V_{WL,H}$, which may be a voltage selected to selectively activate cell selection components 230-*a*, such as a voltage applied to a gate of an n-type transistor of a cell selection component 230-*a* that is above a threshold voltage of the transistor). Bit lines 210-*a*, for example, may be selectively biased with a relatively lower voltage (e.g., $V_{BL,L}$, which may be a ground voltage) or a relatively higher voltage (e.g., $V_{BL,H}$, which may be a voltage chosen to write a particular logic state to target memory cells 105-*a*, or a voltage chosen to identify a logic state stored by target memory cells 105-*a*, as in a read operation). The independently-controllable source lines 215-*a*, for example, may be selectively biased with a relatively lower voltage (e.g., $V_{SL,L}$, which may be a ground voltage) or a relatively higher voltage (e.g., $V_{SL,H}$, which may be a voltage chosen to write a particular logic state to target memory cells 105-*a*, or a voltage chosen to identify a logic state stored by target memory cells 105-*a*, as in a read operation).

Prior to the operations of timing diagram 500, all of the word lines 205-*a*, the bit lines 210-*a*, and the source lines 215-*a* may be biased to a low level, or deactivated state. In some examples, prior to the operations of the timing diagram 500, the circuit 200 may be in a standby state, or a transition period following a preceding access operation. In other examples, any one or more of the word lines 205-*a*, the bit lines 210-*a*, or the source lines 215-*a* may be biased to a different level, which, in some cases, may be a final condition of a preceding access operation.

At 501, the target bit line 210-*a* (e.g., bit line 210-*a*-1, a target column) may be biased to a relatively higher voltage (e.g., $V_{BL,H}$). As a result of the operations of 501, the memory cells 105-*a* of the target column (e.g., memory cells 105-*a*-11 through 105-*a*-1*n*) may be biased with a voltage (e.g., a voltage difference between the target bit line 210-*a*-1 and the target source line 215-*a*-1, equal to $V_{BL,H}$-$V_{BL,L}$). However, because the cell selection components 230-*a* along the column associated with the target bit line 210-*a* (e.g., cell selection components 230-*a*-11 through 230-*a*-1*n*) are not activated, current may not flow across the target memory cell 105-*a* or other memory cells 105-*a* in the target column. In other words, despite the voltage difference between the target bit line 210-*a* and the target source line 215-*a*, current may not flow across memory cells 105-*a* of the activated column (e.g., memory cells 105-*a*-11 through 105-*a*-1*n*) at 501. Further, as a result of isolation provided by the deactivated target cell selection components 230-*a* of the target bit line 210-*a*, the corresponding first nodes 221-*a* may not rise to the voltage of the target bit line 210-*a* (e.g., first nodes 221-*a*-11 through 221-*a*-1*n* may not be at $V_{BL,H}$ at 501).

At 502, the target word line 205-*a* (e.g., word line 205-*a*-1, a target row) may be biased to a relatively higher voltage (e.g., $V_{WL,H}$). As a result of the operations of 502, one or more of the cell selection components 230-*a* of the target row (e.g., each of the cell selection components 230-*a*-11 through 230-*a*-*m*1) may be activated. Thus, the first nodes 221-*a* of the target row may be selectively coupled with a corresponding bit line 210-*a* (e.g., first node 221-*a*-11 may be selectively coupled with bit line 210-*a*-1, first node 221-*a*-12 may be selectively coupled with bit line 210-*a*-2, and so on), which may permit current to flow through the respective memory cells 105-*a* of the target row. However, in this case, current may not flow through non-target memory cells 105-*a* of the target row (e.g., memory cells 105-*a*-21 through 105-*a*-*m*1) because there may not be a voltage applied across the non-target memory cells 105-*a* (e.g., because the corresponding non-target bit lines 210-*a* may be at a voltage $V_{BL,L}$, the non-target source lines 215-*a* may be at a voltage $V_{SL,L}$, and $V_{BL,L}$ may be the same as $V_{SL,L}$). Further, because cell selection components 230-*a* of non-target memory cells along the target bit line 210-*a* (e.g., cell selection components 230-*a*-12 through 230-*a*-1*n*) remain deactivated (e.g., because non-target word lines 205-*a*-2 through 205-*a*-*n* remain at a deselected voltage, $V_{WL,L}$), current may still be inhibited across the non-target memory cells 105-*a* of the target column (e.g., current may be inhibited across memory cells 105-*a*-12 through 105-*a*-1*n*).

At 503, an access operation may be performed on the target memory cell 105-*a*-11. Although described with respect to a particular time (e.g., at 503), the described access operation may occur over various durations between 502 and 504 (e.g., as a voltage difference is developed across the material portion 220-*a*-11, over a duration during which a voltage difference is maintained across the material portion 220-*a*-11).

In one example, when the target memory cell 105-*a*-11 has been selected for a write operation, the voltage difference across the material portion 220-*a*-11 (e.g., $V_{BL,H}$-$V_{SL,L}$) may be selected to have a magnitude that is high enough to write a desired logic state. In some examples, the voltage difference across the material portion 220-*a*-11 may be selected to be higher than a threshold voltage of the material portion 220-*a*-11, regardless of the previously stored logic state. In other words, the magnitude of the voltage difference across the material portion 220-*a*-11 may be higher than the respective threshold voltages of the material portion 220-*a*-11 for each of logic states that may be stored by the material portion 220-*a*-11. Accordingly, to support a write operation at 503, the voltage difference across the material portion 220-*a*-11 may be configured drive a current across the material portion 220-*a*-11. In the example of timing diagram 500, the voltage across the material portion 220-*a*-11 may have a positive polarity (e.g., where a voltage at the first node 221-*a*-11 is higher than a voltage at the second node 222-*a*-11), which may be associated with writing a particular logic state (e.g., a logic state different than a logic state that would be written with a negative polarity).

In the example of a write operation, the non-target memory cells 105-*a* of the target column may be less susceptible to disturbance (e.g., degradation of a stored logic state) at 503 using the described architecture for memory cells than other architectures. For example, although a voltage difference is applied across the non-target memory cells 105-*a* (e.g., $V_{BL,H}$-$V_{SL,L}$), current flow through the non-target memory cells 105-*a* may be blocked or otherwise inhibited by the deactivated cell selection components 230-*a* of the non-target memory cells 105-*a* according to the described architecture.

In another example, when the target memory cell 105-*a*-11 has been selected for a read operation, the voltage difference across the material portion 220-*a*-11 (e.g., $V_{BL,H}$-$V_{SL,L}$) may be selected to have a magnitude that is between threshold voltages of logic states that may be stored by the material portion 220-*a*-11. For example, to support a read operation at 503, the voltage difference across the material portion 220-*a*-11 may be configured with a magnitude that is greater than a threshold voltage of a first logic state (e.g., as written with a first voltage polarity), but below a threshold voltage of a second logic state (e.g., as written with a second voltage polarity different than the first voltage polarity). Thus, when the timing diagram 500 illustrates a read operation, a presence or absence of current across the target memory cell 105-*a*-11 (e.g., a presence or absence of a current along the target bit line 210-*a*-1, as detected at the sense component 150-*a*) at 503 may be used to determine whether the target memory cell 105-*a*-11 stored the first logic state or the second logic state. In examples where the voltage across the material portion 220-*a*-11 has a positive polarity (e.g., where a voltage at the first node 221-*a*-11 is higher than a voltage at the second node 222-*a*-11), the operations of 503 may illustrate a read operation with a positive voltage polarity.

In the example of a read operation, the detection of the stored logic state of the memory cell 105-*a*-11 may be improved by the described architecture for memory cells because current through non-target memory cells 105-*a* of the target column may be blocked or otherwise inhibited by the deactivated cell selection components 230-*a* of the non-target memory cells, thereby blocking or otherwise inhibiting leakage current or inadvertent thresholding of the non-target memory cells 105-*a*. Thus, by blocking or otherwise inhibiting current through non-target memory cells 105-*a*, the current detected by the sense component (e.g., $I_{BL,1}$) may be more representative of the current flowing through the target memory cell 105-*a*-11, which may improve read margins as compared to architectures where leakage or inadvertent thresholding is not inhibited by such a cell selection component 230-*a*.

At 504, the target word line 205-*a* (e.g., word line 205-*a*-1) may be biased to a relatively lower voltage (e.g., $V_{WL,L}$). As a result of the operations of 504, one or more of the cell selection components 230-*a* of the target row (e.g., each of the cell selection components 230-*a*-11 through 230-*a*-*m*1) may be deactivated. Thus, the first nodes 221-*a* of the target row may be selectively isolated from a corresponding bit line 210-*a* (e.g., first node 221-*a*-11 may be selectively isolated from bit line 210-*a*-1, first node 221-*a*-12 may be selectively isolated from bit line 210-*a*-2, and so on), which may inhibit current from flowing through the respective memory cells 105-*a* of the target row.

At 505, the target bit line 210-*a* (e.g., bit line 210-*a*-1) may be biased to a relatively lower voltage (e.g., $V_{BL,L}$). As a result of the operations of 505, the memory cells 105-*a* of the target column (e.g., memory cells 105-*a*-11 through 105-*a*-1*n*) may be biased with a voltage equal to $V_{BL,L} - V_{BL,L}$, which, in some examples, may be a zero bias (e.g., when $V_{BL,L}$ equals $V_{SL,L}$). In some examples, at 505 each of the word lines 205-*a*, bit lines 210-*a*, and source lines 215-*a* may be grounded or otherwise commonly biased.

The order of operations shown in the timing diagram 500 is for illustration only, and various other orders and combinations of steps may be performed in accordance with the present disclosure. For example, the relative order of operations of 501 and 502 may be swapped, or the operations of 501 and 502 may occur at the same time or during overlapping intervals. Additionally or alternatively, the relative order of operations of 504 and 505 may be swapped, or the operations of 504 and 505 may occur at the same time or during overlapping intervals.

Further, the timing of the operations of the timing diagram 500 is also for illustration purposes only, and is not meant to indicate a particular relative duration between one operation and another. For example, although the target bit line is illustrated as being activated over a longer duration than the target word line is activated, in some examples, a target word line may be activated over a longer duration than a target bit line. In another example, the operations of 501 and 502 may be relatively closely spaced in time, and the operations of 504 and 505 may be relatively closely spaced in time, whereas the operations of 502 and 504 may be spaced relatively far in time (e.g., to support read or write operations or responses occurring based on the difference in voltage between the target bit line and the target source line). Further, although operations of the timing diagram 500 are described with reference to a point in time, the operations, or responses to such operations, may occur over various durations in time. Various operations may occur over a duration or time interval that is relatively shorter or relatively longer than illustrated in various examples of polarity-written cell architectures for a memory device in accordance with the present disclosure.

Figure 6:
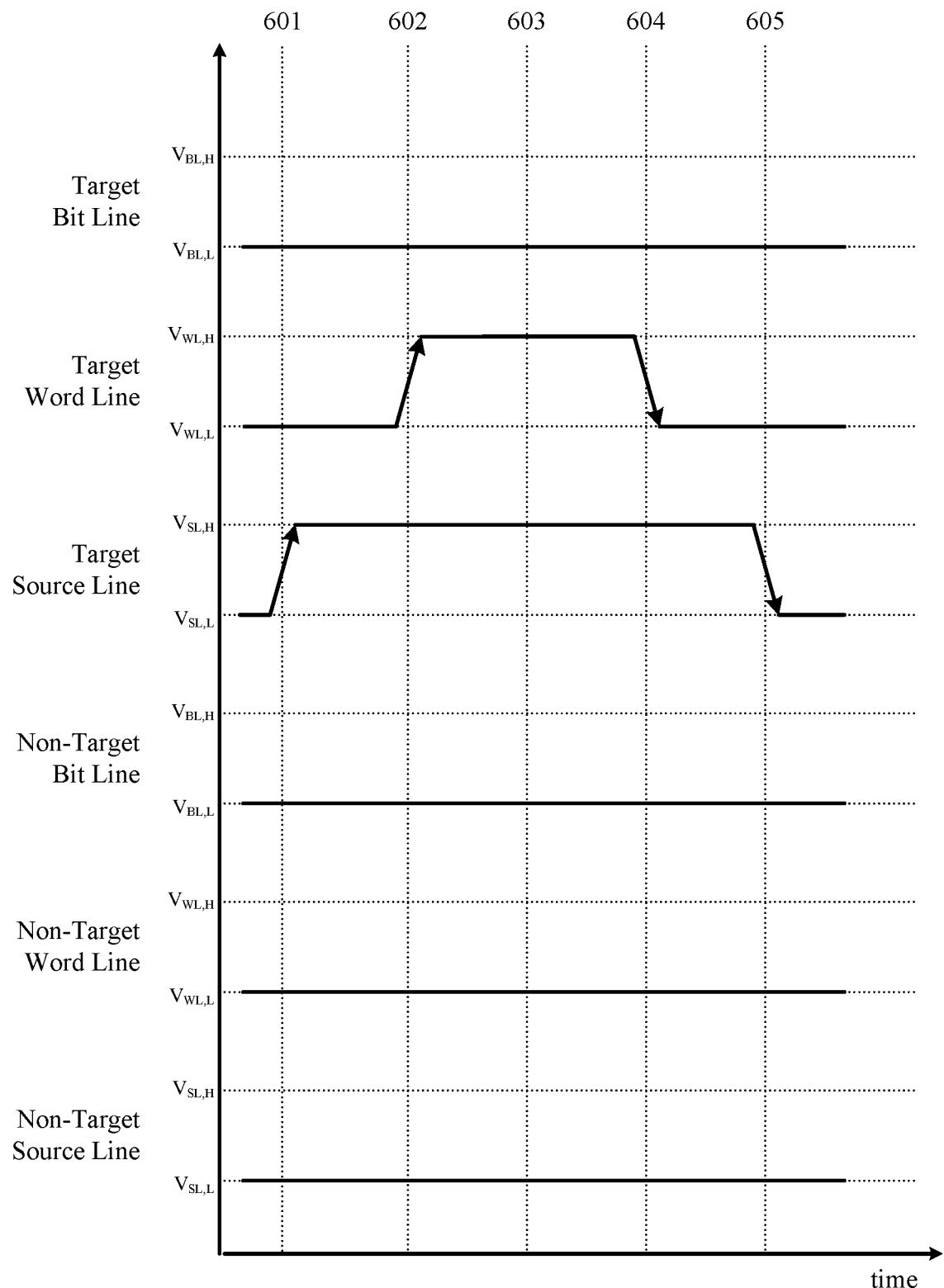
FIG. 6 illustrates an example of a timing diagram that supports polarity-written cell architectures for a memory device in accordance with examples as disclosed herein.

FIG. 6 illustrates an example of a timing diagram 600 that supports polarity-written cell architectures for a memory device in accordance with examples as disclosed herein. The timing diagram may be performed by a memory device, such as memory device 100 described with reference to FIG. 1. The timing diagram 600 is described with reference to components of the example circuit 200 described with reference to FIG. 2, but may be illustrative of operations that may be performed with different circuit arrangements as well. In the example of timing diagram 600, the circuit 200 may be an example where the source lines 215-*a* are independently controllable (e.g., where source line 215-*a*-1 may be biased independently from, or at a different voltage than source lines 215-*a*-2 through 215-*a*-*m*). Thus, references to source lines 215-*a* of the timing diagram 600 may refer to operations applied to a target source line 215-*a* versus a non-target source line 215-*a*.

In the example of timing diagram 600, the memory cell 105-*a*-11 may be selected for an access operation (e.g., prior to the operations of timing diagram 600). Thus, the memory cell 105-*a*-11 may be a target memory cell, whereas other memory cells 105-*a* of the circuit 200 (e.g., memory cells 105-*a*-12 through 105-*a*-1*n* of the same column as the target memory cell 105-*a*-11, memory cells 105-*a*-21 through 105-*a*-*m*1 of the same row as the target memory cell 105-*a*-11, memory cells 105-*a*-22 through 105-*a*-*mn* that do not share an access line with the target memory cell 105-*a*-11) may be non-target memory cells. In various examples, the target memory cell 105-*a*-11 may be selected for a write operation, a read operation, a rewrite operation, a refresh operation, or other access operation, and aspects of operations (e.g., relative timings, durations, voltage levels) illustrated by the timing diagram 600 may be adjusted accordingly.

The timing diagram 600 is described with reference to biasing of word lines 205-*a*, bit lines 210-*a*, and source lines 215-*a*. Word lines 205-*a*, for example, may be selectively biased with a relatively lower voltage (e.g., $V_{WL,L}$, which may be a ground voltage) or a relatively higher voltage (e.g., $V_{WL,H}$, which may be a voltage selected to selectively activate cell selection components 230-*a*, such as a voltage applied to a gate of an n-type transistor of a cell selection component 230-*a* that is above a threshold voltage of the transistor). Bit lines 210-*a*, for example, may be selectively biased with a relatively lower voltage (e.g., $V_{BL,L}$, which may be a ground voltage) or a relatively higher voltage (e.g., $V_{BL,H}$, which may be a voltage chosen to write a particular logic state to target memory cells 105-*a*, or a voltage chosen to identify a logic state stored by target memory cells 105-*a*, as in a read operation). The independently-controllable source lines 215-*a*, for example, may be selectively biased with a relatively lower voltage (e.g., $V_{SL,L}$, which may be a ground voltage) or a relatively higher voltage (e.g., $V_{SL,H}$, which may be a voltage chosen to write a particular logic state to target memory cells 105-*a*, or a voltage chosen to identify a logic state stored by target memory cells 105-*a*, as in a read operation).

Prior to the operations of timing diagram 600, all of the word lines 205-*a*, the bit lines 210-*a*, and the source lines 215-*a* may be biased to a low level, or deactivated state. In some examples, prior to the operations of the timing diagram 600, the circuit 200 may be in a standby state, or a transition period following a preceding access operation. In other examples, any one or more of the word lines 205-*a*, the bit lines 210-*a*, or the source lines 215-*a* may be biased to a different level, which, in some cases, may be a final condition of a preceding access operation.

At 601, the target source line 215-*a* (e.g., source line 215-*a*-1, a target column) may be biased to a relatively higher voltage (e.g., $V_{SL,H}$). As a result of the operations of 601, the memory cells 105-*a* of the target column (e.g., memory cells 105-*a*-11 through 105-*a*-1*n*) may be biased with a voltage (e.g., a voltage difference between the target bit line 210-*a*-1 and the target source line 215-*a*-1, equal to $V_{BL,L}$-$V_{SL,H}$). However, because the cell selection components 230-*a* along the column associated with the target source line 215-*a* (e.g., cell selection components 230-*a*-11 through 230-*a*-1*n*) are not activated, current may not flow across the target memory cell 105-*a* or other memory cells 105-*a* in the target column. In other words, despite the voltage difference between the target bit line 210-*a* and the target source line 215-*a*, current may not flow across memory cells 105-*a* of the activated column (e.g., memory cells 105-*a*-11 through 105-*a*-1*n*) at 601.

At 602, the target word line 205-*a* (e.g., word line 205-*a*-1, a target row) may be biased to a relatively higher voltage (e.g., $V_{WL,H}$). As a result of the operations of 602, one or more of the cell selection components 230-*a* of the target row (e.g., each of the cell selection components 230-*a*-11 through 230-*a*-*m*1) may be activated. Thus, the first nodes 221-*a* of the target row may be selectively coupled with a corresponding bit line 210-*a* (e.g., first node 221-*a*-11 may be selectively coupled with bit line 210-*a*-1, first node 221-*a*-12 may be selectively coupled with bit line 210-*a*-2, and so on), which may permit current to flow through the respective memory cells 105-*a* of the target row. However, in this case, current may not flow through non-target memory cells 105-*a* of the target row (e.g., memory cells 105-*a*-21 through 105-*a*-*m*1) because there may not be a voltage applied across the non-target memory cells 105-*a* (e.g., because the corresponding non-target bit lines 210-*a* may be at a voltage $V_{BL,L}$, the non-target source lines 215-*a* may be at a voltage $V_{SL,L}$, and $V_{BL,L}$ may be the same as $V_{SL,L}$). Further, because cell selection components 230-*a* of non-target memory cells along the target bit line 210-*a* (e.g., cell selection components 230-*a*-12 through 230-*a*-1*n*) remain deactivated (e.g., because non-target word lines 205-*a*-2 through 205-*a*-*n* remain at a deselected voltage, $V_{WL,L}$), current may still be inhibited across the non-target memory cells 105-*a* of the target column (e.g., current may be inhibited across memory cells 105-*a*-12 through 105-*a*-1*n*).

At 603, an access operation may be performed on the target memory cell 105-*a*-11. Although described with respect to a particular time (e.g., at 603), the described access operation may occur over various durations between 602 and 604 (e.g., as a voltage difference is developed across the material portion 220-*a*-11, over a duration during which a voltage difference is maintained across the material portion 220-*a*-11).

In one example, when the target memory cell 105-*a*-11 has been selected for a write operation, the voltage difference across the material portion 220-*a*-11 (e.g., $V_{BL,L}$-$V_{SL,H}$) may be selected to have a magnitude that is high enough to write a desired logic state. In some examples, the voltage difference across the material portion 220-*a*-11 may be selected to be higher than a threshold voltage of the material portion 220-*a*-11, regardless of the previously stored logic state. In other words, the magnitude of the voltage difference across the material portion 220-*a*-11 may be higher than the respective threshold voltages of the material portion 220-*a*-11 for each of logic states that may be stored by the material portion 220-*a*-11. Accordingly, to support a write operation at 603, the voltage difference across the material portion 220-*a*-11 may be configured drive a current across the material portion 220-*a*-11. In the example of timing diagram 600, the voltage across the material portion 220-*a*-11 may have a negative polarity (e.g., where a voltage at the first node 221-*a*-11 is lower than a voltage at the second node 222-*a*-11), which may be associated with writing a particular logic state (e.g., a logic state different than a logic state that would be written with a positive polarity, a logic state different than a logic state that would be written according to the timing diagram 500).

In the example of a write operation, the non-target memory cells 105-*a* of the target column may be less susceptible to disturbance (e.g., degradation of a stored logic state) at 603 using the described architecture for memory cells than other architectures. For example, although a voltage difference is applied across the non-target memory cells 105-*a* (e.g., $V_{BL,H}$-$V_{SL,L}$), current flow through the non-target memory cells 105-*a* may be blocked or otherwise inhibited by the deactivated cell selection components 230-*a* of the non-target memory cells 105-*a* according to the described architecture.

In another example, when the target memory cell 105-*a*-11 has been selected for a read operation, the voltage difference across the material portion 220-*a*-11 (e.g., $V_{BL,H}$-$V_{SL,L}$) may be selected to have a magnitude that is between threshold voltages of logic states that may be stored by the material portion 220-*a*-11. For example, to support a read operation at 603, the voltage difference across the material portion 220-*a*-11 may be configured with a magnitude that is greater than a threshold voltage of a first logic state (e.g., as written with a first voltage polarity), but below a threshold voltage of a second logic state (e.g., as written with a second voltage polarity different than the first voltage polarity). Thus, when the timing diagram 600 illustrates a read operation, a presence or absence of current across the target memory cell 105-*a*-11 (e.g., a presence or absence of a current along the target bit line 210-*a*-1, as detected at the sense component 150-*a*) at 603 may be used to determine whether the target memory cell 105-*a*-11 stored the first logic state or the second logic state. In examples where the voltage across the material portion 220-*a*-11 has a positive polarity (e.g., where a voltage at the first node 221-*a*-11 is higher than a voltage at the second node 222-*a*-11), the operations of 603 may illustrate a read operation with a positive voltage polarity.

In the example of a read operation, the detection of the stored logic state of the memory cell 105-*a*-11 may be improved by the described architecture for memory cells because current through non-target memory cells 105-*a* of the target column may be blocked or otherwise inhibited by the deactivated cell selection components 230-*a* of the non-target memory cells, thereby blocking or otherwise inhibiting leakage current or inadvertent thresholding of the non-target memory cells 105-*a*. Thus, by blocking or otherwise inhibiting current through non-target memory cells 105-*a*, the current detected by the sense component (e.g., $I_{BL,1}$) may be more representative of the current flowing through the target memory cell 105-*a*-11, which may improve read margins as compared to architectures where leakage or inadvertent thresholding is not inhibited by such a cell selection component 230-*a*.

At 604, the target word line 205-*a* (e.g., word line 205-*a*-1) may be biased to a relatively lower voltage (e.g., $V_{WL,L}$). As a result of the operations of 604, one or more of the cell selection components 230-*a* of the target row (e.g., each of the cell selection components 230-*a*-11 through 230-*a*-*m*1) may be deactivated. Thus, the first nodes 221-*a* of the target row may be selectively isolated from a corresponding bit line 210-*a* (e.g., first node 221-*a*-11 may be selectively isolated from bit line 210-*a*-1, first node 221-*a*-12 may be selectively isolated from bit line 210-*a*-2, and so on), which may inhibit current from flowing through the respective memory cells 105-*a* of the target row.

At 605, the target bit line 210-*a* (e.g., bit line 210-*a*-1) may be biased to a relatively lower voltage (e.g., $V_{BL,L}$). As a result of the operations of 605, the memory cells 105-*a* of the target column (e.g., memory cells 105-*a*-11 through 105-*a*-1*n*) may be biased with a voltage equal to $V_{BL,L}$-$V_{BL,L}$, which, in some examples, may be a zero bias (e.g., when $V_{BL,L}$ equals $V_{SL,L}$). In some examples, at 605 each of the word lines 205-*a*, bit lines 210-*a*, and source lines 215-*a* may be grounded or otherwise commonly biased.

The order of operations shown in the timing diagram 600 is for illustration only, and various other orders and combinations of steps may be performed in accordance with the present disclosure. For example, the relative order of operations of 601 and 602 may be swapped, or the operations of 601 and 602 may occur at the same time or during overlapping intervals. Additionally or alternatively, the relative order of operations of 604 and 605 may be swapped, or the operations of 604 and 605 may occur at the same time or during overlapping intervals.

Further, the timing of the operations of the timing diagram 600 is also for illustration purposes only, and is not meant to indicate a particular relative duration between one operation and another. For example, although the target bit line is illustrated as being activated over a longer duration than the target word line is activated, in some examples, a target word line may be activated over a longer duration than a target bit line. In another example, the operations of 601 and 602 may be relatively closely spaced in time, and the operations of 604 and 605 may be relatively closely spaced in time, whereas the operations of 602 and 604 may be spaced relatively far in time (e.g., to support read or write operations or responses occurring based on the difference in voltage between the target bit line and the common source plate). Further, although operations of the timing diagram 600 are described with reference to a point in time, the operations, or responses to such operations, may occur over various durations in time. Various operations may occur over a duration or time interval that is relatively shorter or relatively longer than illustrated in various examples of polarity-written cell architectures for a memory device in accordance with the present disclosure.

The transitions of the signals of the timing diagrams 300 through 600 are illustrative of transitions from one state to another, and may reflect transitions between a disabled or deactivated state (e.g., a relatively low state or bias, a state "0") and an enabled or activated state (e.g., a relatively high state or bias, a state "1") as associated with a particular numbered operation. In some examples, the states may be associated with a particular voltage of a logical signal (e.g., a logical input voltage applied to a gate of a transistor operating as a switch), and the change in voltage from one state to another may not be instantaneous. Rather, in some examples, a voltage associated with a logical signal may follow a ramping behavior, or time-constant (e.g., logarithmic or exponential) behavior over time from one logical state to another.

In some examples, the transition of a component from one state to another may be based on characteristics of the associated logical signal, including the voltage level of the logical signal or the transition characteristics of the logical signal itself. Thus, the transitions shown in the timing diagrams 300 through 600 are not necessarily indicative of an instantaneous transition. Further, the initial state of a logical signal associated with a transition at a numbered operation may have been arrived during various times preceding the numbered operation while still supporting the described transitions and associated operations. Although logical signals are described as a transition between logical states, the voltage of a logical signal may be selected to operate a component at a particular working point (e.g., in an active region or in a saturation region), and may be the same as, or different than a voltage of other logical signals.

Figure 7:
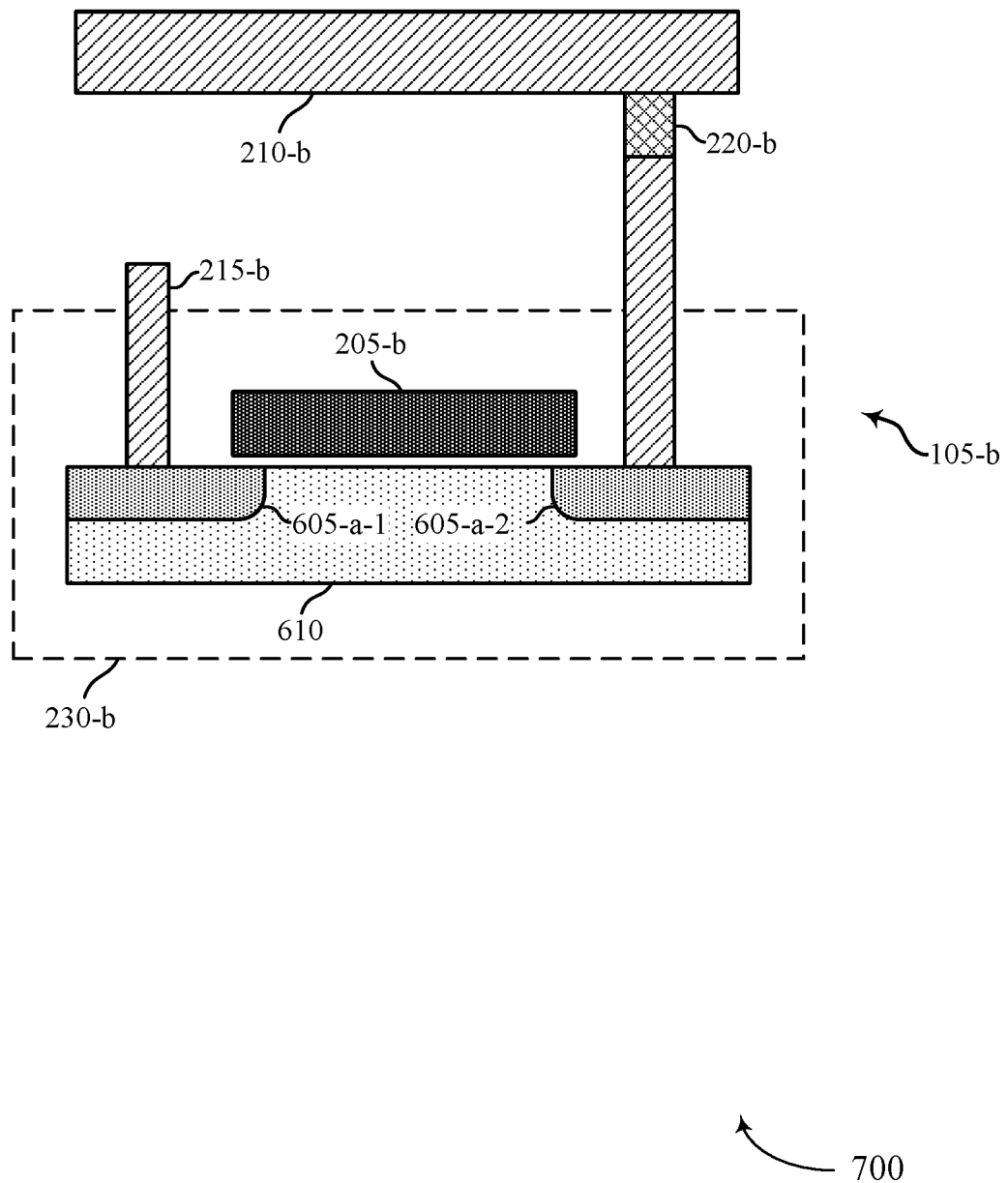
FIG. 7 illustrates an example of a cell structure that supports polarity-written cell architectures for a memory device in accordance with examples as disclosed herein.

FIG. 7 illustrates an example of a cell structure 700 that supports polarity-written cell architectures for a memory device in accordance with examples as disclosed herein. The cell structure 700 may include a material portion 220-*b* and a cell selection component 230-*b*, which may refer to components of a memory cell 105-*b*. In the example of cell structure 700, the material portion 220-*b* may be coupled with a bit line 210-*b*, and the cell selection component 230-*b* may be coupled with a source line 215-*b*, which in various examples may be a common source line 215-*b* (e.g., a common source plate or node), or may be an independently-controllable source line 215-*b*. In other examples, the relative positions of the bit line 210-*b* and the source line 215-*b* may be swapped, such that the material portion 220-*b* may be coupled with the source line 215-*b* and the cell selection component 230-*b* may be coupled with the bit line 210-*b*.

The cell selection component 230-*b* may include an n-channel transistor having N+ doped regions 605-*a* and a P-sub region 610. The cell selection component 230-*b* may be activated when a voltage of a word line 205-*b* (e.g., coupled with or otherwise referring to a gate of the n-channel transistor) is greater than a threshold voltage of the n-channel transistor. In other words, when the word line 205-*b* is biased with a voltage greater than the threshold voltage of the n-channel transistor, a conductive path may be supported between the N+ doped region 605-*a*-1 and the N+ doped region 605-*a*-2 (e.g., via the P-sub region 610).

It is to be understood that the cell structure 700 illustrated in FIG. 7 is merely an example, and that other physical layouts may utilized, including for a cell selection component 230. For example, a cell selection component 230 (e.g., a transistor) having a vertical channel region (e.g., fabricated to at least partially surround or otherwise be in contact with a vertical gate oxide layer, such as a gate oxide layer around or in contact with a vertical pillar). This or other various in layout of a cell selection component 230 or other aspects of a memory cell 105 may be optimized in view of layout (e.g., areal or vertical) constraints or other constraints (e.g., fabrication considerations). For example, a source line 215-*b* may be shared among adjacent symmetrically (e.g., specular, mirrored) designed memory cells 105-*b* (not shown). In one example of such a shared source line 215-*b*, a memory cell 105 adjacent to the memory cell 105-*b* illustrated in FIG. 7 may be reproduced in specular (e.g., mirrored) manner, to the left of the memory cell 105-*b*, where elements of the memory cell 105-*b* may be "translated" until the representative source lines 215-*b* of the two memory cells 105 overlap. In other words, the adjacent memory cells 105 may share a single source line 215-*b* that serves both of the adjacent memory cells 105, and each memory cell 105 may be uniquely or separately selected by its own respective word line 205 (e.g., that is not shared with the other of the memory cells 105).

Figure 8:
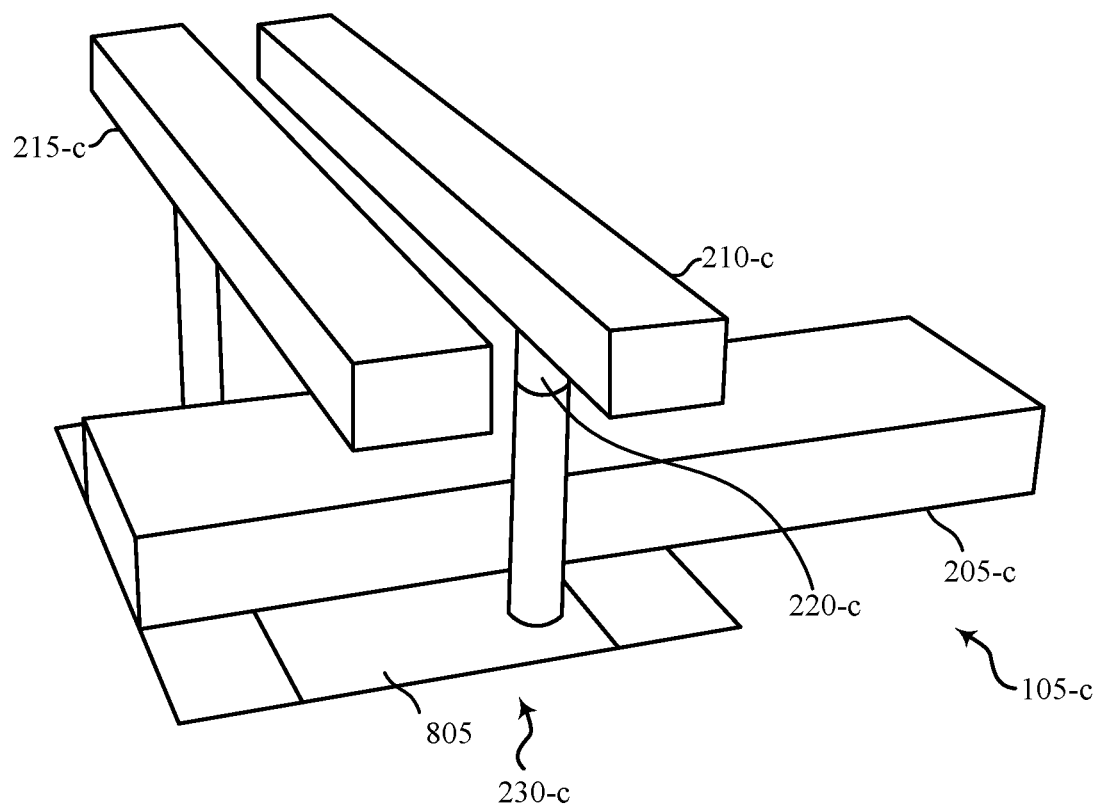
FIG. 8 illustrates an example of a cell structure that supports polarity-written cell architectures for a memory device in accordance with examples as disclosed herein.

FIG. 8 illustrates an example of a cell structure 800 that supports polarity-written cell architectures for a memory device in accordance with examples as disclosed herein. The cell structure 800 may include a material portion 220-*c* and a cell selection component 230-*c*, which may refer to components of a memory cell 105-*c*. In the example of cell layout 800, the material portion 220-*c* may be coupled with a bit line 210-*c*, and the cell selection component 230-*c* may be coupled with a source line 215-*c*, which in various examples may be a common source line 215-*c* (e.g., a common source plate or node), or may be an independently-controllable source line 215-*c*. In other examples, the relative positions of the bit line 210-*c* and the source line 215-*c* may be swapped, such that the material portion 220-*c* may be coupled with the source line 215-*c* and the cell selection component 230-*c* may be coupled with the bit line 210-*c*. In some examples, the bit line 210-*c* and the source line 215-*c* may be formed in a same layer of a memory die. In some examples, the bit line 210-*c* and the source line 215-*c* may be orthogonal to each other (not shown), in which case the bit line 210-*c* and the source line 215-*c* may be formed on different layers of a memory die.

The cell selection component 230-*c* may include an n-channel transistor having N+ doped regions and a P-sub region, such as similar regions described with reference to cell layout 700. In some examples, one or both of the bit line 210-*c* or the source line 215-*c* may be coupled with the cell selection component 230-*c* (e.g., at a drain region 805) using a pillar that extends between or through formation layers associated with the cell structure 800. The cell selection component 230-*c* may be activated when a voltage of a word line 205-*c* (e.g., coupled with or otherwise referring to a gate of the n-channel transistor) is greater than a threshold voltage of the n-channel transistor. In other words, when the word line 205-*c* is biased with a voltage greater than the threshold voltage of the n-channel transistor, a conductive path may be supported between bit line 210-*c* and the source line 215-*c* (e.g., through the material portion 220-*c*).

It is to be understood that the cell structure 800 illustrated in FIG. 7 is merely an example, and that other physical layouts may utilized, including for a cell selection component 230. For example, a cell selection component 230 (e.g., a transistor) having a vertical channel region (e.g., fabricated to at least partially surround or otherwise be in contact with a vertical gate oxide layer, such as a gate oxide layer around or in contact with a vertical pillar). This or other various in layout of a cell selection component 230 or other aspects of a memory cell 105 may be optimized in view of layout (e.g., areal or vertical) constraints or other constraints (e.g., fabrication considerations).

Figure 9:
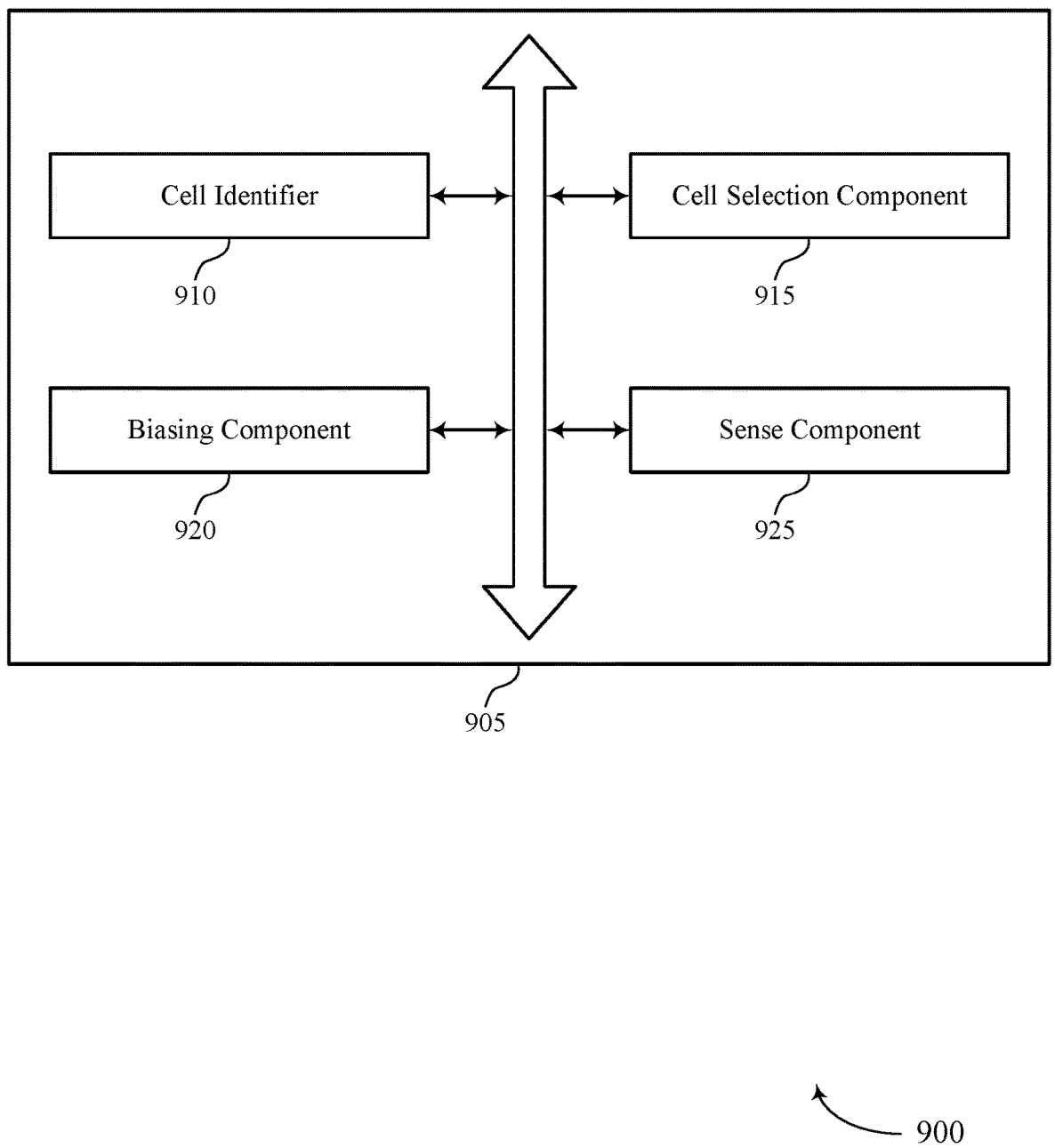
FIG. 9 shows a block diagram of a memory device that supports polarity-written cell architectures for a memory device in accordance with aspects of the present disclosure.

FIG. 9 shows a block diagram 900 of a memory device 905 that supports polarity-written cell architectures for a memory device in accordance with examples as disclosed herein. The memory device 905 may be an example of aspects of a memory device, system, or circuitry as described with reference to FIGS. 1 through 8. The memory device 905 may include a cell identifier 910, a cell selection component 915, a biasing component 920, and a sense component 925. Each of these components may communicate, directly or indirectly, with one another (e.g., via one or more buses).

In some examples, the cell identifier 910 may identify a memory cell that includes a material coupled with one of a first set of access lines, where the material is configured to store one of a set of logic states. In some examples, each logic state of the set may be associated with a respective voltage polarity (e.g., of a write operation). In some examples, the set of logic states may be associated with an amorphous state of the material (e.g., the material may be configured to store at least two logic states of the set of logic states while in an amorphous material state). In some examples, the cell identifier 910 may identify a memory cell including a chalcogenide material coupled with one of a first set of access lines and configured to store one of a set of logic states associated with an amorphous state of the chalcogenide material.

In some examples, the cell selection component 915 may couple the material of a memory cell with one of a second set of access lines using a cell selection component of the memory cell. In some examples, the cell selection component 915 may couple a chalcogenide material of a memory cell with one of a second set of access lines via a cell selection component of the memory cell.

In some examples, a cell selection component 915 may isolate, during a writing to the material of a first memory cell, a material of a second memory cell from the one of the second set of access lines via a cell selection component of the second memory cell. In some examples, the cell selection component 915 may isolate, during a writing to a material of a first memory cell, a material of a third memory cell from another of the second set of access lines via a cell selection component of the third memory cell.

In some examples, the cell selection component 915 may isolate, during the applying of a read voltage across a first memory cell, a chalcogenide material of a second memory cell from the one of the second set of access lines via a cell selection component of the second memory cell. In some examples, the cell selection component 915 may isolate, during the applying of a read voltage across a memory cell, a chalcogenide material of a third memory cell from another of the second set of access lines via a cell selection component of the third memory cell.

In some examples, the biasing component 920 may write, to the material of a memory cell, a first of the set of logic states based on a polarity of a write voltage applied between the one of the first set of access lines and the one of the second set of access lines. In some examples, the biasing component 920 may apply a first voltage to the one of the first set of access lines. In some examples, the biasing component 920 may apply a second voltage that is different than the first voltage to the one of the second set of access lines. In some examples, the biasing component 920 may apply, to another of the first set of access lines during the writing, a third voltage that is different than the first voltage. In some examples, the biasing component 920 may apply, to another of the second set of access lines during the writing, a fourth voltage that is different than the second voltage. In some examples, the biasing component 920 may apply the second voltage to another of the second set of access lines during the writing. In some cases, the written logic state is based on a current through the material, and the current may be based on the applied write voltage.

In some examples, the biasing component 920 may apply a read voltage across a memory cell, where applying the read voltage includes applying a first voltage to the one of the first set of access lines and applying a second voltage to the one of the second set of access lines.

The sense component 925 may determine a logic state stored by the memory cell based on applying the read voltage, the logic state based on a threshold voltage of the chalcogenide material of the memory cell. In some examples, the sense component 925 may determine the logic state stored by the memory cell is based on a current through the memory cell that is responsive to the read voltage.

In some cases, the material is configured to have a first threshold voltage in the amorphous state when the write voltage has a first polarity and a second threshold voltage in the amorphous state when the write voltage has a second polarity, the first threshold voltage and the second threshold voltage respectively corresponding to a first logic state and a second logic state of the set of logic states.

Figure 10:
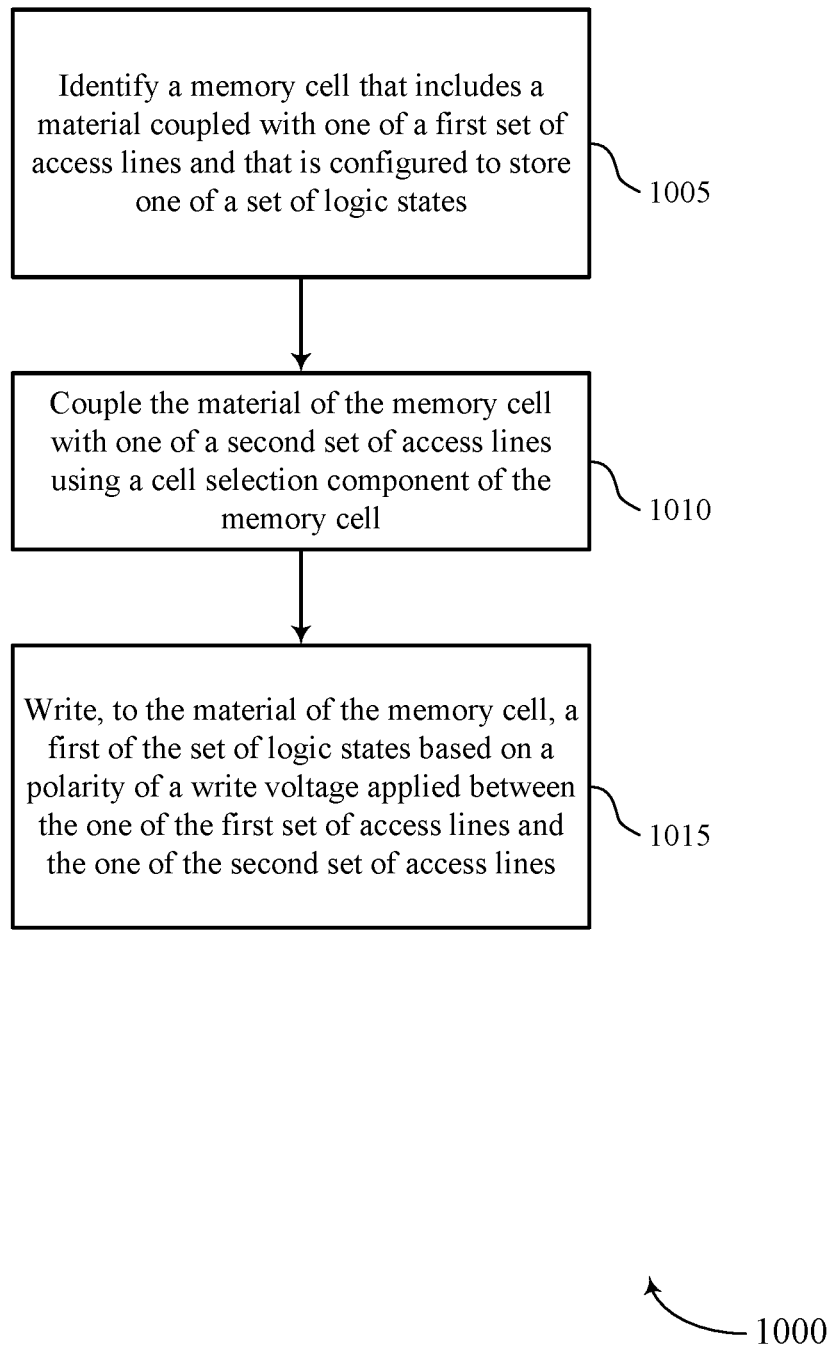
FIGS. 10 and 11 show flowcharts illustrating a method or methods that support polarity-written cell architectures for a memory device in accordance with examples as disclosed herein.

FIG. 10 shows a flowchart illustrating a method or methods 1000 that supports polarity-written cell architectures for a memory device in accordance with aspects of the present disclosure. The operations of method 1000 may be implemented by a memory device or its components as described herein. For example, the operations of method 1000 may be performed by a memory device as described with reference to FIG. 9. In some examples, a memory device may execute a set of instructions to control functional elements of the memory device to perform the described functions. Additionally or alternatively, a memory device may perform aspects of the described functions using special-purpose circuitry or hardware.

At 1005, the memory device may identify a memory cell that includes a material coupled with one of a first set of access lines and that is configured to store one of a set of logic states. In some examples, each of the logic states may be associated with a respective voltage polarity (e.g., of a write operation). In some examples, the set of logic states may be associated with an amorphous state of the material (e.g., a chalcogenide material). The operations of 1005 may be performed according to the methods described herein. In some examples, aspects of the operations of 1005 may be performed by a cell identifier as described with reference to FIG. 9.

At 1010, the memory device may couple the material of the memory cell with one of a second set of access lines using a cell selection component of the memory cell. The operations of 1010 may be performed according to the methods described herein. In some examples, aspects of the operations of 1010 may be performed by a cell selection component as described with reference to FIG. 9.

At 1015, the memory device may write, to the material of the memory cell, a first of the set of logic states based on a polarity of a write voltage applied between the one of the first set of access lines and the one of the second set of access lines. The operations of 1015 may be performed according to the methods described herein. In some examples, aspects of the operations of 1015 may be performed by a biasing component as described with reference to FIG. 9.

In some examples, an apparatus as described herein may perform a method or methods, such as the method 1000. The apparatus may include features, circuitry, means, or instructions (e.g., a non-transitory computer-readable medium storing instructions executable by a processor) for identifying a memory cell that includes a material coupled with one of a first set of access lines and that is configured to store one of a set of logic states, coupling the material of the memory cell with one of a second set of access lines using a cell selection component of the memory cell, and writing, to the material of the memory cell, a first of the set of logic states based on a polarity of a write voltage applied between the one of the first set of access lines and the one of the second set of access lines.

Some examples of the method 1000 and the apparatus described herein may further include operations, features, circuitry, means, or instructions for isolating, during the writing to the material of the memory cell, a material of a second memory cell from the one of the second set of access lines via a cell selection component of the second memory cell.

Some examples of the method 1000 and the apparatus described herein may further include operations, features, circuitry, means, or instructions for isolating, during the writing to the material of the memory cell, a material of a third memory cell from another of the second set of access lines via a cell selection component of the third memory cell.

In some examples of the method 1000 and the apparatus described herein, the writing may include operations, features, circuitry, means, or instructions for applying a first voltage to the one of the first set of access lines, and applying a second voltage that is different than the first voltage to the one of the second set of access lines.

Some examples of the method 1000 and the apparatus described herein may further include operations, features, circuitry, means, or instructions for applying, to another of the first set of access lines during the writing, a third voltage that is different than the first voltage.

Some examples of the method 1000 and the apparatus described herein may further include operations, features, circuitry, means, or instructions for applying, to another of the second set of access lines during the writing, a fourth voltage that is different than the second voltage.

Some examples of the method 1000 and the apparatus described herein may further include operations, features, circuitry, means, or instructions for applying the second voltage to another of the second set of access lines during the writing.

In some examples of the method 1000 and the apparatus described herein, the material may be configured to have a first threshold voltage in an amorphous state when the write voltage has a first polarity and a second threshold voltage in the amorphous state when the write voltage has a second polarity, where the first threshold voltage and the second threshold voltage respectively correspond to a first logic state and a second logic state of the set of logic states.

In some examples of the method 1000 and the apparatus described herein, the written logic state may be based on a current through the material, the current based on the applied write voltage. In some examples of the method 1000 and the apparatus described herein, the written logic state may be based on a heating of the material.

Figure 11:
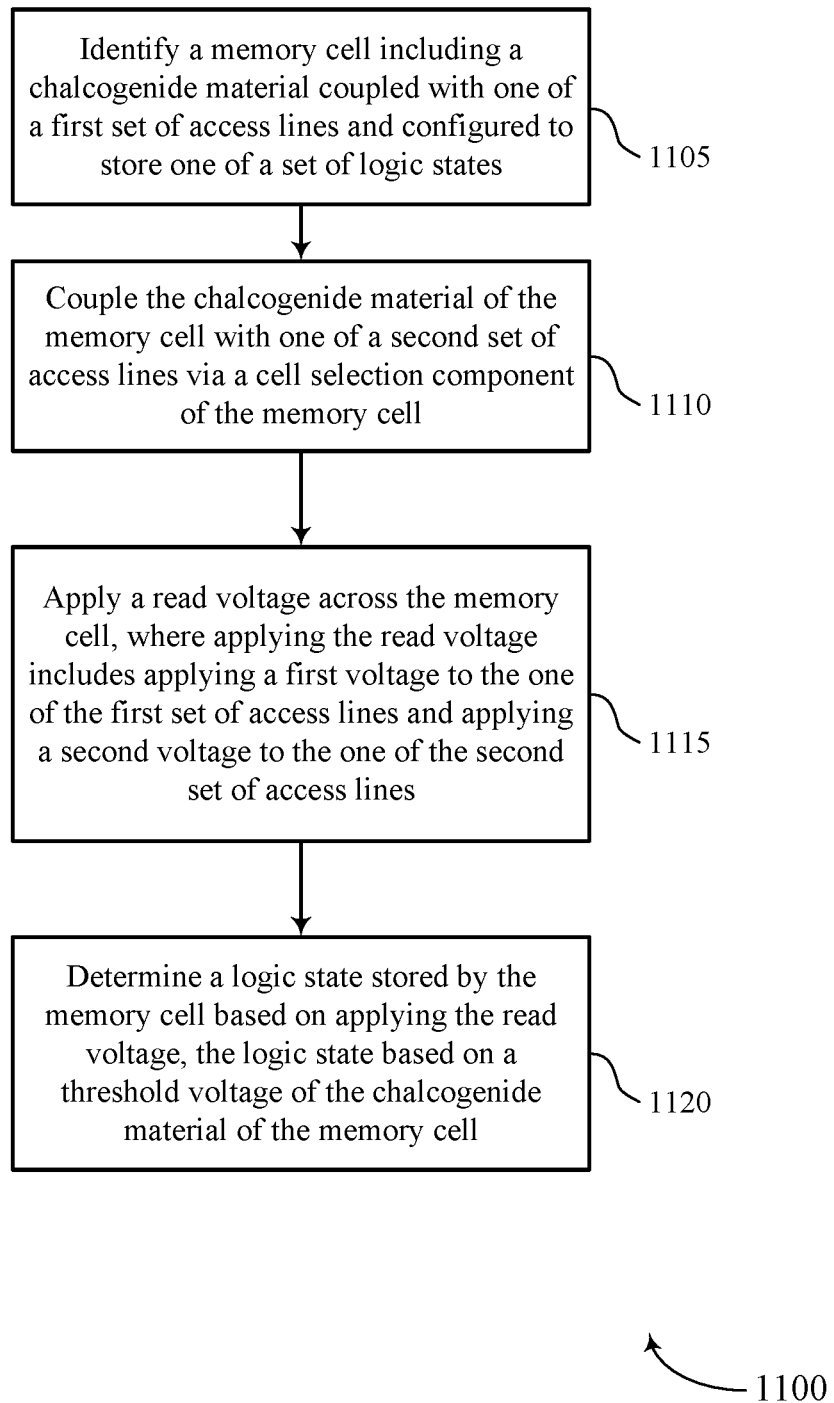

FIG. 11 shows a flowchart illustrating a method or methods 1100 that supports polarity-written cell architectures for a memory device in accordance with aspects of the present disclosure. The operations of method 1100 may be implemented by a memory device or its components as described herein. For example, the operations of method 1100 may be performed by a memory device as described with reference to FIG. 9. In some examples, a memory device may execute a set of instructions to control the functional elements of the memory device to perform the described functions. Additionally or alternatively, a memory device may perform aspects of the described functions using special-purpose circuitry or hardware.

At 1105, the memory device may identify a memory cell including a chalcogenide material coupled with one of a first set of access lines and configured to store one of a set of logic states of the chalcogenide material. In some examples, each of the logic states may be associated with a respective voltage polarity (e.g., of a write operation). In some examples, the set of logic states may be associated with an amorphous state of the chalcogenide material. The operations of 1105 may be performed according to the methods described herein. In some examples, aspects of the operations of 1105 may be performed by a cell identifier as described with reference to FIG. 9.

At 1110, the memory device may couple the chalcogenide material of the memory cell with one of a second set of access lines via a cell selection component of the memory cell. The operations of 1110 may be performed according to the methods described herein. In some examples, aspects of the operations of 1110 may be performed by a cell selection component as described with reference to FIG. 9.

At 1115, the memory device may apply a read voltage across the memory cell, where applying the read voltage includes applying a first voltage to the one of the first set of access lines and applying a second voltage to the one of the second set of access lines. The operations of 1115 may be performed according to the methods described herein. In some examples, aspects of the operations of 1115 may be performed by a biasing component as described with reference to FIG. 9.

At 1120, the memory device may determine a logic state stored by the memory cell based on applying the read voltage, the logic state based on a threshold voltage of the chalcogenide material of the memory cell. The operations of 1120 may be performed according to the methods described herein. In some examples, aspects of the operations of 1120 may be performed by a sense component as described with reference to FIG. 9.

In some examples, an apparatus as described herein may perform a method or methods, such as the method 1100. The apparatus may include features, circuitry, means, or instructions (e.g., a non-transitory computer-readable medium storing instructions executable by a processor) for identifying a memory cell including a chalcogenide material coupled with one of a first set of access lines and configured to store one of a set of logic states of the chalcogenide material, coupling the chalcogenide material of the memory cell with one of a second set of access lines via a cell selection component of the memory cell, applying a read voltage across the memory cell, where applying the read voltage includes applying a first voltage to the one of the first set of access lines and applying a second voltage to the one of the second set of access lines, and determining a logic state stored by the memory cell based on applying the read voltage, the logic state based on a threshold voltage of the chalcogenide material of the memory cell. In some examples, each of the logic states may be associated with a respective voltage polarity (e.g., of a write operation). In some examples, the set of logic states may be associated with an amorphous state of the chalcogenide material.

Some examples of the method 1100 and the apparatus described herein may further include operations, features, circuitry, means, or instructions for isolating, during the applying of the read voltage across the memory cell, a chalcogenide material of a second memory cell from the one of the second set of access lines via a cell selection component of the second memory cell.

Some examples of the method 1100 and the apparatus described herein may further include operations, features, circuitry, means, or instructions for isolating, during the applying of the read voltage across the memory cell, a chalcogenide material of a third memory cell from another of the second set of access lines via a cell selection component of the third memory cell.

Some examples of the method 1100 and the apparatus described herein may further include operations, features, circuitry, means, or instructions for determining the logic state stored by the memory cell based on a current through the memory cell that is responsive to the read voltage.

It should be noted that the described methods are possible implementations, and that the operations and the steps may be rearranged or otherwise modified and that other implementations are possible. Further, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain, and the unexposed regions may be removed.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
    a first plurality of access lines;
    a second plurality of access lines;
    a third plurality of access lines;
    a plurality of memory cells, each memory cell of the plurality of memory cells comprising:
        a material coupled with one of the first plurality of access lines and configured to store one of a set of logic states based at least in part on a polarity of a write voltage applied to the material; and
        a cell selection component configured to selectively couple the material with one of the second plurality of access lines based at least in part on one of the third plurality of access lines corresponding to a target memory cell being biased at a first voltage, wherein:
        to read the target memory cell coupled with one of the first plurality of access lines, the apparatus is configured to bias each of the first plurality of access lines other than the one of the first plurality of access lines at a second voltage while maintaining the one of the first plurality of access lines coupled with the target memory cell at a third voltage less than the second voltage throughout a duration in which the each of the first plurality of access lines are biased at the second voltage; and
        each of the second plurality of access lines is configured to be commonly biased with each other of the second plurality of access lines; and
    circuitry coupled with the first plurality of access lines, the second plurality of access lines, and the third plurality of access lines, the circuitry configured to write a first logic state of the set of logic states to the target memory cell based at least in part on:
        applying a fourth voltage to the one of the first plurality of access lines;
        applying the third voltage to each of the second plurality of access lines; and
        applying the third voltage to each of the first plurality of access lines other than the one of the first plurality of access lines.

2. The apparatus of claim 1, wherein the material is configured to have a first threshold voltage when the write voltage has a first polarity and a second threshold voltage when the write voltage has a second polarity, the first threshold voltage and the second threshold voltage respectively corresponding to the first logic state and a second logic state of the set of logic states.

3. The apparatus of claim 1, wherein the cell selection component of each of the plurality of memory cells comprises a transistor, and the one of the third plurality of access lines is coupled with a gate of the transistor.

4. The apparatus of claim 1, wherein the material is configured to store at least two logic states of the set of logic states while in an amorphous material state.

5. The apparatus of claim 1, further comprising:
    circuitry coupled with the first plurality of access lines, the second plurality of access lines, and the third plurality of access lines, the circuitry configured to:
    write, to the target memory cell of the plurality of memory cells, the first logic state of the set of logic states based at least in part on setting the one of the first plurality of access lines associated with the target memory cell to a higher voltage than the one of the second plurality of access lines associated with the target memory cell; and
    write, to the target memory cell, a second logic state of the set of logic states based at least in part on setting the one of the first plurality of access lines associated with the target memory cell to a lower voltage than the one of the second plurality of access lines associated with the target memory cell.

6. The apparatus of claim 5, wherein:
    the circuitry is configured to couple, via the cell selection component of the target memory cell, the material of the target memory cell with the one of the second plurality of access lines associated with the target memory cell while writing the first logic state to the target memory cell or writing the second logic state to the target memory cell; and
    the target memory cell is configured for current flow through the material based at least in part on the coupling.

7. The apparatus of claim 5, wherein the circuitry is configured to:
    isolate, via the cell selection component of a second memory cell, the material of the second memory cell from the one of the second plurality of access lines associated with the second memory cell while writing the first logic state to the target memory cell or writing the second logic state to the target memory cell.

8. The apparatus of claim 1, wherein:
to read the memory cell, the circuitry is further configured to:
determine one of the set of logic states as stored by the material of the target memory cell based at least in part on a current through the target memory cell while the one of the third plurality of access lines corresponding to the target memory cell is biased at the first voltage.

9. The apparatus of claim 1, wherein the material is configured to store, one of the set of logic states based at least in part on the polarity of the write voltage and a current through the material during application of the write voltage.

10. The apparatus of claim 1, wherein the material is configured to store one of the set of logic states based at least in part on the polarity of the write voltage and a heating of the material.

11. The apparatus of claim 1, wherein the material is a chalcogenide material.

12. The apparatus of claim 1, wherein the circuitry is further configured to write a second logic state of the set of logic states to the target memory cell of the plurality of memory cells based at least in part on:
applying the third voltage to the one of the first plurality of access lines;
applying the fourth voltage to each of the second plurality of access lines, the fourth voltage different than the second voltage; and
applying the fourth voltage to each of the first plurality of access lines other than the one of the first plurality of access lines, the fourth voltage different than the third voltage.

13. A method, comprising:
identifying a memory cell that comprises a material coupled with one of a first plurality of access lines and that is configured to store one of a set of logic states;
coupling the material of the memory cell, using a cell selection component of the memory cell, with one of a second plurality of access lines based at least in part on one of a third plurality of access lines corresponding to a target memory cell being biased at a first voltage wherein:
each of the first plurality of access lines is configured to be biased independently of at least one other of the first plurality of access lines; and
each of the second plurality of access lines is configured to be commonly biased with each other of the second plurality of access lines;
reading the one of the set of logic states based at least in part on biasing each of the first plurality of access lines other than the one of the first plurality of access lines at a second voltage while maintaining the one of the first plurality of access lines coupled with the target memory cell at a third voltage less than the second voltage throughout a duration in which the each of the first plurality of access lines are biased at the second voltage, wherein the one of the set of logic states is based at least in part on a polarity of a write voltage previously applied between the one of the first plurality of access lines and each of the second plurality of access lines; and
writing a first logic state of the set of logic states to the target memory cell based at least in part on:
applying a fourth voltage to the one of the first plurality of access lines;
applying the third voltage to each of the second plurality of access lines; and
applying the third voltage to each of the first plurality of access lines other than the one of the first plurality of access lines.

14. The method of claim 13, further comprising:
isolating, during the reading, a material of a second memory cell from the one of the second plurality of access lines via a cell selection component of the second memory cell.

15. The method of claim 13, further comprising:
isolating, during the reading, a material of a third memory cell from another of the second plurality of access lines via a cell selection component of the third memory cell.

16. The method of claim 13, wherein the reading comprises:
applying the second voltage to each of the second plurality of access lines.

17. The method of claim 13, wherein the material is configured to have a first threshold voltage when the write voltage has a first polarity and a second threshold voltage when the write voltage has a second polarity, the first threshold voltage and the second threshold voltage respectively corresponding to the first logic state and a second logic state of the set of logic states.

18. The method of claim 13, wherein the reading is based at least in part on a current through the material, the current based at least in part on a difference between the second voltage and the third voltage.

19. The method of claim 13, wherein the material is a chalcogenide material.

20. The method of claim 13, wherein the reading comprises:
grounding the one of the first plurality of access lines;
increasing a voltage of each of the second plurality of access lines; and
increasing a voltage of each of the first plurality of access lines other than the one of the first plurality of access lines.

* * * * *